(12) United States Patent
Xu et al.

(10) Patent No.: US 12,217,695 B2
(45) Date of Patent: Feb. 4, 2025

(54) DISPLAY SUBSTRATE AND DISPLAY APPARATUS

(71) Applicant: BOE Technology Group Co., Ltd., Beijing (CN)

(72) Inventors: Pan Xu, Beijing (CN); Hongli Wang, Beijing (CN); Danyang Ma, Beijing (CN); Guoying Wang, Beijing (CN); Xing Zhang, Beijing (CN); Chengyuan Luo, Beijing (CN); Ying Han, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/794,994

(22) PCT Filed: Aug. 24, 2021

(86) PCT No.: PCT/CN2021/114328
§ 371 (c)(1),
(2) Date: Jul. 25, 2022

(87) PCT Pub. No.: WO2023/023944
PCT Pub. Date: Mar. 2, 2023

(65) Prior Publication Data
US 2024/0212622 A1 Jun. 27, 2024

(51) Int. Cl.
*G09G 3/3266* (2016.01)
*H10K 59/131* (2023.01)

(52) U.S. Cl.
CPC ... *G09G 3/3266* (2013.01); *G09G 2310/0281* (2013.01); *G09G 2310/0286* (2013.01); *H10K 59/131* (2023.02)

(58) Field of Classification Search
CPC .. H10L 27/14812; G09G 3/20; G09G 3/3225; G09G 3/3275; G09G 3/3266;
(Continued)

(56) References Cited

U.S. PATENT DOCUMENTS 7,893,948 B1 * 2/2011 Mittan ............... G09F 9/33
345/589
12,008,973 B2 * 6/2024 Ishige ............... G02F 1/1345
(Continued)

FOREIGN PATENT DOCUMENTS

CN 109345956 A 2/2019
CN 109410761 A 3/2019
(Continued)

*Primary Examiner* — Christopher E Leiby
(74) *Attorney, Agent, or Firm* — Ling Wu; Stephen Yang; Ling and Yang Intellectual Property

(57) ABSTRACT

A display substrate includes an underlayer substrate and a circuit structure layer. The circuit structure layer is located in a display area of the underlayer substrate. The circuit structure layer includes at least one first circuit area and at least one second circuit area. The first circuit area includes at least one first gate drive circuit; the second circuit area includes at least one second gate drive circuit. The first gate drive circuit is cascaded with the second gate drive circuit. The first gate drive circuit includes a plurality of cascaded first gate drive units, and the second gate drive circuit includes a plurality of cascaded second gate drive units. A plurality of first gate drive units are sequentially arranged in a second direction, and a plurality of second gate drive units are sequentially arranged in the second direction.

17 Claims, 11 Drawing Sheets

(58) Field of Classification Search
CPC ... G09G 2300/0426; G09G 2300/0408; G09G 2310/0281; G09G 2310/0286; G09G 2310/0264; H10K 59/131
See application file for complete search history.

(56) References Cited

U.S. PATENT DOCUMENTS

| | | | | |
|---|---|---|---|---|
| 2008/0048934 | A1* | 2/2008 | Yamamoto | G09G 3/3611 345/55 |
| 2010/0013853 | A1* | 1/2010 | Takatori | H05B 47/16 345/611 |
| 2011/0068999 | A1* | 3/2011 | Street | G09F 9/33 345/55 |
| 2011/0222645 | A1* | 9/2011 | Tobita | G09G 3/3677 377/77 |
| 2019/0012974 | A1* | 1/2019 | Miyanaga | G09G 3/20 |
| 2019/0304392 | A1* | 10/2019 | Yeh | G09G 3/3266 |
| 2019/0385512 | A1* | 12/2019 | Lee | H01L 27/156 |
| 2020/0135832 | A1 | 4/2020 | Ma et al. | |
| 2020/0135833 | A1* | 4/2020 | Ma | H10K 59/131 |
| 2020/0168141 | A1 | 5/2020 | Ma et al. | |
| 2021/0375173 | A1* | 12/2021 | Wang | G09G 3/3233 |
| 2022/0246086 | A1* | 8/2022 | Son | G09G 3/32 |
| 2022/0320855 | A1* | 10/2022 | Hu | H02H 9/005 |
| 2024/0122034 | A1* | 4/2024 | Xu | G09G 3/3266 |

FOREIGN PATENT DOCUMENTS

| | | |
|---|---|---|
| CN | 109817143 A | 5/2019 |
| CN | 109872636 A | 6/2019 |
| CN | 110299075 A | 10/2019 |
| CN | 110910766 A | 3/2020 |
| CN | 111613145 A | 9/2020 |
| CN | 112201195 A | 1/2021 |
| JP | 2009-69776 A | 4/2009 |

* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2021/114328 having an international filing date of Aug. 24, 2021. The above-identified application is hereby incorporated by reference.

TECHNICAL FIELD

The present disclosure relates to, but is not limited to, the field of display technology, in particular to a display substrate and a display device.

BACKGROUND

With the development of display technology, users' demands are becoming more diversified and personalized. Abnormal cut display devices have come to the attention of people gradually, and become an important development direction of the display technology. However, if the bezel of the abnormal cut display device is bulky, it will easily affect the appearance, resulting in poor user experience.

SUMMARY

The following is a summary of subject matters described herein in detail. The summary is not intended to limit the protection scope of claims.

Embodiments of the present disclosure provide a display substrate and a display device.

According to a first aspect, a display substrate is provided in an embodiment of the present disclosure, which includes an underlayer substrate and a circuit structure layer. The circuit structure layer is located in a display area of the underlayer substrate. The circuit structure layer includes at least one first circuit area and at least one second circuit area. The first circuit area includes at least one first gate drive circuit; the second circuit area includes at least one second gate drive circuit. The first gate drive circuit is cascaded with the second gate drive circuit. The first gate drive circuit includes a plurality of cascaded first gate drive units, and the second gate drive circuit includes a plurality of cascaded second gate drive units. A plurality of first gate drive units are sequentially arranged in a second direction, and a plurality of second gate drive units are sequentially arranged in the second direction. The first circuit area and the second circuit area are misaligned in a first direction. The first direction and the second direction intersect.

In some exemplary implementations, the circuit structure layer further includes pixel circuits in a plurality of rows, wherein pixel circuits in each row include a plurality of pixel circuits arranged along the first direction. In the first circuit area, the pixel circuits in the plurality of rows and a plurality of cascaded first gate drive units are arranged at intervals along the second direction. In the second circuit area, the pixel circuits in the plurality of rows and a plurality of cascaded second gate drive units are arranged at intervals along the second direction.

In some exemplary implementations, the circuit structure layer further includes: a first connection line area; the first connection line area includes at least one first signal line and at least one first connection line; the first signal line includes at least one first sub-signal line and at least one second sub-signal line. The first sub-signal line is electrically connected with the first gate drive circuit, and the second sub-signal line is electrically connected with the second gate drive circuit. The first sub-signal line and the second sub-signal line are electrically connected by at least one first connection line, and the first connection line extends along the first direction.

In some exemplary implementations, the first signal line includes a cascaded signal line between the first gate drive circuit and the second gate drive circuit; alternatively, the plurality of first signal lines include a cascaded signal line between the first gate drive circuit and the second gate drive circuit, and a common signal line of the first gate drive circuit and the second gate drive circuit.

In some exemplary implementations, the first connection area further includes at least one first jumper line extending in the second direction; wherein the first jumper line electrically connects two first connection lines for transmitting a same signal.

In some exemplary implementations, the first jumper line is located on a side of the first connection line away from the underlayer substrate in a plane perpendicular to the display substrate.

In some exemplary implementations, in a plane perpendicular to the display substrate, the display substrate includes a semiconductor layer, a first conductive layer, a second conductive layer, and a third conductive layer which are disposed on the underlayer substrate. The semiconductor layer at least includes: active layers of a plurality of transistors; the first conductive layer at least includes gates of the plurality of transistors and first electrodes of the plurality of capacitors; the second conductive layer at least includes second electrodes of the plurality of capacitors; the third conductive layer includes, at least, first and second electrodes of the plurality of transistors. The first jumper line is located in the third conductive layer, and the first connection line and the second connection line are located in the first conductive layer or the second conductive layer.

In some exemplary implementations, the first jumper line spans at least two rows of pixel circuits in the second direction.

In some exemplary implementations, the display area is further provided with a plurality of data lines extending in the second direction; the first jumper line is disposed in a same layer as the data line.

In some exemplary implementations, the first connection line area includes a plurality of first jumper lines arranged between a plurality of adjacent data lines.

In some exemplary implementations, the circuit structure layer includes two first circuit areas and one second circuit area; the two first circuit areas are sequentially arranged in the first direction; each first circuit area includes a first gate drive circuit and the second circuit area includes a second gate drive circuit. The first gate drive circuit of a first first circuit area provides a first cascaded signal to the second gate drive circuit, and the first gate drive circuit of a second first circuit area provides a second cascaded signal to the second gate drive circuit; impedance of a signal line transmitting the first cascaded signal is substantially the same as impedance of a signal line transmitting the second cascaded signal.

In some exemplary implementations, the structures of the first gate drive circuits within the two first circuit areas are substantially the same.

In some exemplary implementations, the display areas are substantially symmetrical about a center line in the first direction.

In some exemplary implementations, the display area is heart-shaped, or letter Y-shaped.

In some exemplary implementations, the circuit structure layer further includes: a third circuit area including at least one third gate drive circuit; the third gate drive circuit includes a plurality of cascaded third gate drive units arranged sequentially along a second direction. The third circuit area is misaligned from the two first circuit areas in the first direction and is located on a side of the two first circuit areas away from the second circuit area in the second direction. The third gate drive circuit is cascaded with the first gate drive circuits within the two first circuit areas.

In some exemplary implementations, the display area is elliptical or annular.

In some exemplary implementations, aspect ratios of output transistors of the first gate drive units of the first gate drive circuits with the two first circuit areas are different.

In some exemplary implementations, the display area is letter D-shaped.

In some exemplary implementations, a first gate drive circuit within one of the first circuit areas includes a first sub-circuit and a second sub-circuit which are cascaded, wherein the first sub-circuit and the second sub-circuit are misaligned in the first direction.

In another aspect, a display device is provided in an embodiment of the present disclosure, which includes the aforementioned display substrate.

After reading and understanding the drawings and the detailed description, other aspects may be understood.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of one or more components in the drawings do not reflect true scales, and are only intended to schematically describe contents of the present disclosure.

DETAILED DESCRIPTION

Figure 1:
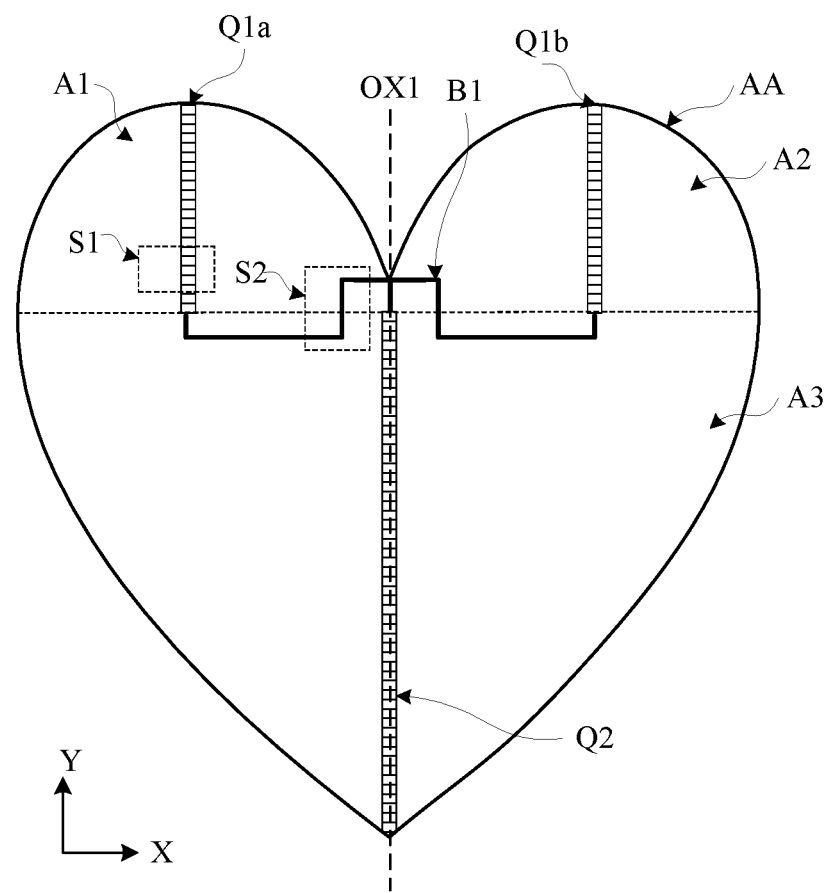
FIG. 1 is a schematic diagram of a structure of a display substrate according to at least one embodiment of the present disclosure.

The embodiments of the present disclosure will be described below in combination with the drawings in detail. Implementation modes may be implemented in multiple different forms. Those of ordinary skill in the art may easily understand such a fact that manners and contents may be transformed into other forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, a mode of the present disclosure is not necessarily limited to the size, and a shape and a size of one or more components in the drawings do not reflect a true proportion. In addition, the drawings schematically illustrate ideal examples, and one embodiment of the present disclosure is not limited to the shapes, numerical values, or the like shown in the drawings.

Ordinal numerals such as "first", "second", and "third" in the specification are set to avoid confusion of constituent elements, but not to set a limit in quantity. In the present disclosure, "multiple" represents two or more than two.

In the specification, for convenience, wordings indicating orientation or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to a direction where the constituent elements are described. Therefore, appropriate replacements can be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand meanings of the above-mentioned terms in the present disclosure according to situations.

In the specification, "electrical connection" includes a case that constituent elements are connected together through an element with a certain electrical effect. The "element having some electrical function" is not particularly limited as long as electrical signals between the connected constituent elements may be transmitted. Examples of the "element having some electrical function" not only include an electrode and a wiring, but further include a switch element such as a transistor, a resistor, an inductor, a capacitor, another element with multiple functions, etc.

In the specification, a transistor refers to an element which at least includes three terminals, i.e., a gate (gate electrode), a drain electrode, and a source electrode. The transistor has a channel region between the drain electrode (drain electrode terminal, drain region, or drain) and the source electrode (source electrode terminal, source region, or source), and a current may flow through the drain electrode, the channel region, and the source electrode. In the specification, the channel region refers to a region through which a current mainly flows.

In the specification, a first electrode may be a drain electrode and a second electrode may be a source electrode, or, a first electrode may be a source electrode and a second electrode may be a drain electrode. In addition, the gate can also be referred to as a control pole. In a case that transistors with opposite polarities are used, or in a case that a direction of a current changes during work of a circuit, or the like, functions of the "source electrode" and the "drain electrode" may sometimes be exchanged. Therefore, the "source electrode" and the "drain electrode" may be exchanged in the specification.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In this specification, heart-shaped, letter Y-shaped, elliptical, annular or letter D-shaped are not strictly defined, but can be approximately heart-shaped, letter Y-shaped, elliptical, annular or letter D-shaped, and can have some small deformation caused by tolerance, and guide angle, arc edge and deformation can exist.

In the present disclosure, "about" and "approximate" refer to a case that a boundary is defined not so strictly and a process and measurement error within a range is allowed. In the present disclosure, "substantially the same" is a case where values differ by less than 10%.

In order to reduce bezels of abnormal cut display devices, a gate drive circuit can be arranged in a display area, that is, the Gate Driver In AA (GIA) technology. For a regularly shaped display device (e.g., a rectangular screen, a rounded rectangular screen, etc.), an arrangement of a gate drive circuit within the display area may be similar to an arrangement of a gate drive circuit disposed in the bezel area. For example, the gate drive circuit includes a plurality of cascaded gate drive units, which may be sequentially arranged in one direction from a gate drive unit in a first stage to a gate drive unit in a last stage. However, for a display device with a peculiar shape (for example, a heart-shaped screen, a letter-shaped screen, etc.), a gate drive unit of a gate drive circuit located in a display area cannot be successively arranged from a first stage to a last stage in one direction. Moreover, for a display device having a shape with two small ends and a large intermediate region (e.g., a circular screen, an elliptical screen, etc.), because pixel circuit rows in the intermediate region have a larger quantity of pixel circuits and larger impedance loads (i.e. RC Loadings), and pixel circuit rows in the two end regions have a smaller quantity of pixel circuits and smaller impedance loads, requirements for gate drive signals are inconsistent.

A display substrate is provided in at least one embodiment of the present disclosure, which includes an underlayer substrate, a display structure layer disposed on the underlayer substrate. The circuit structure layer is located in a display area of the underlayer substrate, and includes at least one first circuit area and at least one second circuit area. The first circuit area includes at least one first gate drive circuit; and the second circuit area includes at least one second gate drive circuit. The first gate drive circuit is cascaded with the second gate drive circuit. The first gate drive circuit includes a plurality of cascaded first gate drive units, and the second gate drive circuit includes a plurality of cascaded second gate drive units. A plurality of first gate drive units are sequentially arranged in a second direction, and a plurality of second gate drive units are sequentially arranged in the second direction. The first circuit area and the second circuit area are misaligned in a first direction. The first direction and the second direction intersect. In some examples, the first direction may be perpendicular to the second direction.

In some exemplary implementations, the display substrate in the present embodiment may be an Organic Light Emitting Diode (OLED) display substrate or a Quantum-dot Light Emitting Diode (QLED) display substrate. However, this embodiment is not limited thereto.

According to the display substrate provided in the embodiment, the gate drive circuit disposed in the display area is arranged in sections, so as to be suitable for an abnormal cut display substrate, thereby reducing the bezel of the abnormal cut display substrate and further optimizing the appearance of a personalized display product.

In some exemplary implementations, the first circuit area may include at least one first gate drive circuit; and the second circuit area may include at least one second gate drive circuit. A quantity of first gate drive circuits in the first circuit area may be the same as a quantity of second gate drive circuits in the second circuit area. For example, a plurality of first gate drive circuits of the first circuit area and a plurality of second gate drive circuits of the second circuit area may be cascaded in one-to-one correspondence. The first gate drive circuit may be electrically connected with the second gate drive circuit by a cascaded signal line. In some examples, the first circuit area may include a first gate drive circuit (e.g., a scan drive circuit), and the second circuit area may include one second gate drive circuit (e.g., a scan drive circuit), the scan drive circuit within the first circuit area is cascaded with the scan drive circuit within the second circuit area; the first gate drive circuit and the second gate drive circuit may be configured to provide scan signals to a plurality of pixel circuits within the display area. In other examples, The first circuit area may include two first gate drive circuits (e.g., a scan drive circuit and a light emitting drive circuit), wherein the second circuit area may include two second gate drive circuits (e.g., the scan drive circuit and the light emitting drive circuit), the scan drive circuit within the first circuit area is cascaded with the scan drive circuit within the second circuit area, and the light emitting drive circuit within the first circuit area and the light emitting drive circuit within the second circuit area are cascaded. The scan drive circuit is configured to provide a scan signal and a reset signal to a plurality of pixel circuits within the display area, and the light emitting drive circuit is configured to provide a light emitting control signal to a plurality of pixel circuits within the display area. However, this embodiment is not limited thereto.

In some exemplary implementations, the circuit structure layer may further include pixel circuits in a plurality of rows, wherein pixel circuits in each row include a plurality of pixel circuits arranged along the first direction. In some examples, in a plane parallel to the display substrate, the circuit structure layer may include a plurality of pixel circuits, a plurality of pixel circuits sequentially disposed along a first direction are referred to as pixel circuits in a row, and a plurality of pixel circuits sequentially disposed along a second direction are referred to as pixel circuits in a column. Pixel circuits in a plurality of rows and pixel circuits in a plurality of columns form a pixel circuit array. In some examples, the first direction may be a horizontal direction and the second direction may be a vertical direction. However, this embodiment is not limited thereto.

In some exemplary implementations, in the first circuit area, the pixel circuits in the plurality of rows and a plurality of cascaded first gate drive units are arranged at intervals along the second direction. In the second circuit area, the pixel circuits in the plurality of rows and a plurality of cascaded second gate drive units are arranged at intervals along the second direction. In this example, the pixel circuits within the display area may be arranged in an array, and the first gate drive unit and the second gate drive unit may be disposed between pixel circuit rows. In some examples, a first gate drive unit is provided between pixel circuits in two adjacent rows in a second direction in a first circuit area; in the second circuit area, a second gate drive unit is provided between pixel circuits in two adjacent rows in the second direction. For example, a first gate drive unit in an i-th stage may be located between pixel circuits in an (i−1)-th row and pixel circuits in an i-th row, and configured to provide a gate control signal to the pixel circuits in the i-th row, wherein the i may be an integer. In the present exemplary implementation, by arranging the first gate drive unit or the second gate drive unit between pixel circuits in adjacent rows, it is possible to achieve the layout of the gate drive circuit in the display area without affecting the display effect of the display substrate, thereby achieving a display product with a narrow bezel.

In some exemplary implementations, the circuit structure layer further includes a first connection line area. The first connection line area may include at least one first signal line and at least one first connection line. The first signal line may include at least one first sub-signal line and at least one second sub-signal line. The first sub-signal line is electrically connected to the first gate drive circuit within the first circuit area, and the second sub-signal line is electrically connected to the second gate drive circuit within the second circuit area. The first sub-signal line and the second sub-signal line are electrically connected by at least one first connection line, and the first connection line extends along the first direction. In some examples, both of the first sub-data line and the second sub-data line extend along the second direction. In this example, because the first circuit area and the second circuit area are misaligned in the first direction, signal transmission between the first circuit area and the second circuit area is achieved by providing a first connection line extending in the first direction.

In some exemplary implementations, the first signal line may include a cascaded signal line between the first gate drive circuit and the second gate drive circuit; alternatively, the plurality of first signal lines may include a cascaded signal line between the first gate drive circuit and the second gate drive circuit, and a common signal line of the first gate drive circuit and the second gate drive circuit. A cascaded signal line between the first gate drive circuit and the second gate drive circuit is configured to transmit a cascaded signal. A common signal line of the first gate drive circuit and the second gate drive circuit is configured to transmit a common signal, such as a clock signal, a power supply signal and the like. In some examples, the common signal line may be routed in a same manner as the cascaded signal lines. However, this embodiment is not limited thereto. For examples, the common signal line may be routed in a different manner from the cascaded signal lines.

In some exemplary implementations, the first connection area may further include at least one first jumper line extending in the second direction. The first jumper line electrically connects two first connection lines for transmitting a same signal. In some examples, the first sub-signal line is electrically connected with one first connection line, the second sub-signal line is electrically connected with another first connection line, the two first connection lines may be electrically connected by a first jumper line, and a transmission path formed by connecting the first sub-signal line, the first connection line, the first jumper line, the first connection line, and the second sub-signal line may be configured to transmit a cascaded signal or a common signal (e.g., a clock signal or a power supply signal). However, this embodiment is not limited thereto.

In some exemplary implementations, the first jumper line is on a side of the first connection line away from the underlay substrate in a plane perpendicular to the display substrate. However, this embodiment is not limited thereto.

In some exemplary implementations, the circuit structure layer may include k pieces of the first circuit areas and q pieces of the second circuit areas, first gate drive circuits within the k pieces of the first circuit areas are cascaded with second gate drive circuits within the q pieces of the second circuit areas. In some examples, the k and q may be integers greater than or equal to 1, and the K and the q are not 1 at the same time. In some examples, k=2 and q=1, that is, the circuit structure layer includes two first circuit areas and a second circuit area. Two first circuit areas are sequentially arranged in the first direction. The second circuit area is misaligned from the two first circuit areas in the first direction. A first gate drive circuit within a first first circuit area provides a first cascaded signal to a second gate drive circuit within the second circuit area, and a first gate drive circuit within the second first circuit area provides a second cascaded signal to a second gate drive circuit within the second circuit area. Impedance of the signal line for transmitting the first cascaded signal may be substantially the same as impedance of the signal line for transmitting the second cascaded signal. In this example, by configuring the impedance of the signal line for transmitting the first cascaded signal to be substantially the same as the impedance of the signal line for transmitting the second cascaded signal, the consistency of the first cascaded signal and the second cascaded signal in a transmission process can be ensured.

In some exemplary implementations, the display areas may be substantially symmetrical about a center line in the first direction. For example, the display area may be heart-shaped, letter Y-shaped, elliptical, annular, and so on. In some other exemplary implementations, the display areas may be not symmetrical about the center line in the first direction. For example, the display area may be D-shaped, arc-shaped, C-shaped, etc. However, this embodiment is not limited thereto.

Solutions of the embodiment will be described below through some examples.

FIG. 1 is a schematic diagram of a display substrate according to at least one embodiment of the present disclosure. In some exemplary implementations as shown in FIG. 1, the display substrate in the embodiment may include an underlayer substrate and a circuit structure layer disposed on the underlayer substrate. The underlayer substrate may include a display area AA and a border area (not shown) located around the display area AA. In this example, the display area AA may be heart-shaped. For example, the display area AA has a first center line OX1 in a first direction X. The display area AA may be substantially symmetrical about the first center line OX1. However, the embodiment is not limited thereto.

In some exemplary implementations as shown in FIG. 1, the display area AA may include a first sub-display area A1, a second sub-display area A2 and a third sub-display area A3. The first sub-display area A1 and the second sub-display area A2 may be arranged in sequence in the first direction X, and shapes of the first sub-display area A1 and the second sub-display area A2 may be substantially symmetrical about the first center line OX1. In some examples, the first sub-display area A1 and the second sub-display area A2 may be communicated. A third sub-display area A3 is located on a same side of the first sub-display area A1 and the second sub-display area A2 in a second direction Y and communicates with the first sub-display area A1 and the second sub-display area A2. A shape of the third sub-display area A3 may be substantially symmetrical about the first center line OX1. However, this embodiment is not limited thereto. In some examples, the first sub-display area A1 and the second sub-display area A2 may be not communicated.

In some exemplary implementations as shown in FIG. 1, the circuit structure layer may be located in the display area AA of the underlayer substrate. The circuit structure layer may include two first circuit areas Q1a and Q1b, a second circuit area Q2 and a first connection line area B1. The second circuit area Q2 is located on a same side of the two first circuit areas Q1a and Q1b in the second direction Y. The two first circuit areas Q1a and Q1b are arranged in sequence in the first direction X. The second circuit area Q2 and the two first circuit areas Q1a and Q1b are misaligned in the first direction X. For example, the first circuit area Q1a is located in the intermediate region of the first sub-display area A1, the first circuit area Q1b is located in the intermediate region of the second sub-display area A2, and the second circuit area Q2 is located in the intermediate region of the third sub-display area A3. The first connection line area B1 is located between the two first circuit areas Q1a and Q1b and the second circuit area Q2. The first connection line area B1 may overlap with all of the first sub-display area A1, the second sub-display area A2, and the third sub-display area A3.

In some exemplary implementations as shown in FIG. 1, each of first circuit areas Q1a and Q1b may include at least one first gate drive circuit. The second circuit area Q2 may include at least one second gate drive circuit. The first gate drive circuits of the two first circuit areas Q1a and Q1b are each cascaded with the second gate drive circuit of the second circuit area Q2. For example, the first gate drive circuit of the first circuit area Q1a provides a first cascaded signal to the second gate drive circuit of the second circuit area Q2, the first gate drive circuit of the first circuit area Q1b provides a second cascaded signal to the second gate drive circuit of the second circuit area Q2, and the second gate drive circuit of the second circuit area Q2 outputs a gate control signal to a corresponding pixel circuit after receiving the first cascaded signal and the second cascaded signal which are consistent.

In some exemplary implementations, a plurality of pixel circuits within the display area AA may be arranged in an array. In some examples, a quantity of rows of the pixel circuits within the first sub-display area A1 may be the same as a quantity of rows of the pixel circuits within the second sub-display area A2. For example, the first gate drive circuit within the first circuit area Q1a may be configured to provide a gate control signal to s rows of the pixel circuits within the first sub-display area A1 (for example, pixel circuits in a first row to pixel circuits in an s-th row), the first gate drive circuit within the first circuit area Q1b may be configured to provide a gate control signal to the s rows of the pixel circuits within the second sub-display area A2, and the second gate drive circuit within the second circuit area Q2 may be configured to provide gate control signals to pixel circuits in a t-th row to an s-th row (e.g., pixel circuits in an (s+1)-th row to a t-th row) within the third sub-display area A3. Wherein the t and the s are natural numbers, and t is greater than s.

Figure 2:
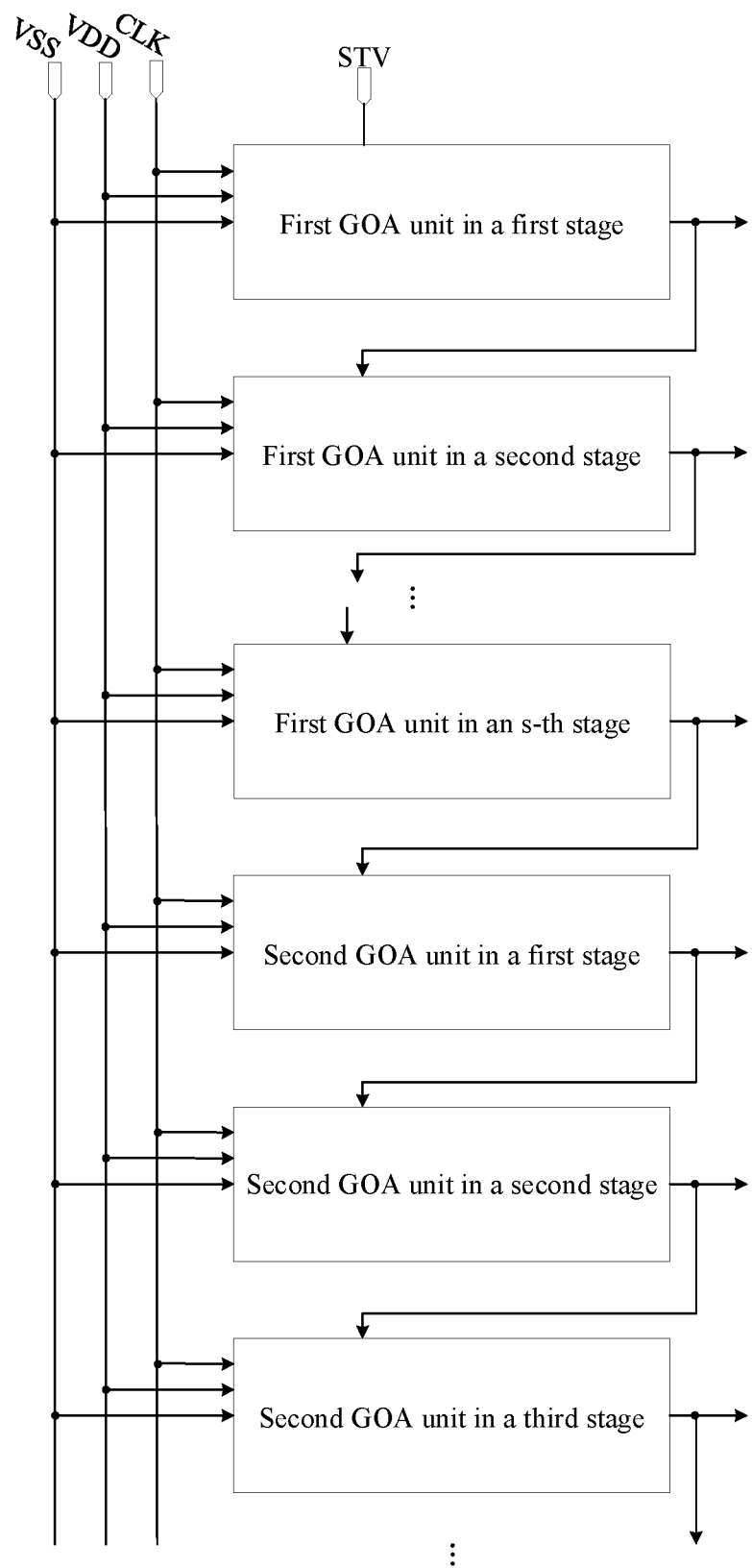
FIG. 2 is a schematic diagram of a cascade connection of a first gate drive circuit to a second gate drive circuit according to at least one embodiment of the present disclosure.

FIG. 2 is a schematic diagram of a cascade connection of a first gate drive circuit to a second gate drive circuit according to at least one embodiment of the present disclosure. In some exemplary implementations as shown in FIG. 2, a first gate drive circuit may include a plurality of cascaded first gate drive units (i.e. first GOA units). The second gate drive circuit may include a plurality of cascaded second gate drive units (i.e. second GOA units). Circuit configurations of the first gate drive unit and the second gate drive unit may be the same, for example, an 8T2C (i.e., eight transistors and two capacitors) configuration, or a 12T4C (i.e., twelve transistors and four capacitors) configuration, etc. However, this embodiment is not limited thereto.

In some exemplary implementations as shown in FIG. 2, a first gate drive unit in a first stage may generate a gate control signal provided to pixel circuits in a first row according to an initial signal provided by an initial signal line STV, a clock signal provided by a clock signal line CLK, a first power supply signal provided by a first power supply line VDD, and a second power supply signal provided by a second power supply line VSS. A first gate drive unit in an i-th stage can generate a gate control signal provided to pixel circuits in an i-th row based on a gate control signal generated by a first gate drive unit in an (i−1)-th stage, a clock signal provided by a clock signal line CLK, a first power supply signal provided by a first power supply line VDD, and a second power supply signal provided by a second power supply line VSS. Where the i is an integer.

In some exemplary implementations as shown in FIG. 2, the first gate drive circuit may include s pieces of cascaded first gate drive units and the second gate drive circuit may include t-s pieces of cascaded second gate drive units. In this example, a first gate drive unit in an s-th stage is electrically connected to a second gate drive unit in a first stage, and provides a cascaded signal (i.e., a gate control signal output by the first gate drive unit in the s-th stage) to the second gate drive unit in the first stage. Wherein, the second gate drive unit in the first stage is a first gate drive unit in an s+1 stage. After the first gate drive circuit and the second gate drive circuit are cascaded, the gate control signal can be provided to pixel circuits in t rows.

In some exemplary implementations as shown in FIG. 1, the first gate drive circuit within the first circuit area Q1*a* may be located in an intermediate region of the first sub-display area A1 in the first direction X, and the plurality of first gate drive units of the first gate drive circuit within the first circuit area Q1*a* may be sequentially arranged in the second direction Y. The first gate drive circuit within the first circuit area Q1*b* may be located in an intermediate region of the second sub-display area A2 in the first direction X, and the plurality of first gate drive units of the first gate drive circuit within the first circuit area Q1*b* may be sequentially arranged in the second direction Y. The second gate drive circuit within the second circuit area Q2 may be located in an intermediate region of the third sub-display area A3 in the first direction X, and the plurality of second gate drive units of the second gate drive circuit within the second circuit area Q2 may be sequentially arranged in the second direction Y. In some examples, the plurality of first gate drive units of the first gate drive circuit within the first circuit area Q1*a* may not be misaligned in the first direction X, the plurality of first gate drive units of the first gate drive circuit within the first circuit area Q1*b* may not be misaligned in the first direction X, and the plurality of second gate drive units of the second gate drive circuit within the second circuit area Q2 may not be misaligned in the first direction X. However, this embodiment is not limited thereto.

In the present exemplary implementation as shown in FIG. 1, arrangement positions of the first gate drive circuits within the first circuit areas Q1*a* and Q1*b* and the second gate drive circuits within the second circuit area Q2 are not successive in the second direction Y. That is, two first gate drive circuits and one second gate drive circuit are misaligned in the first direction X.

Figure 3:
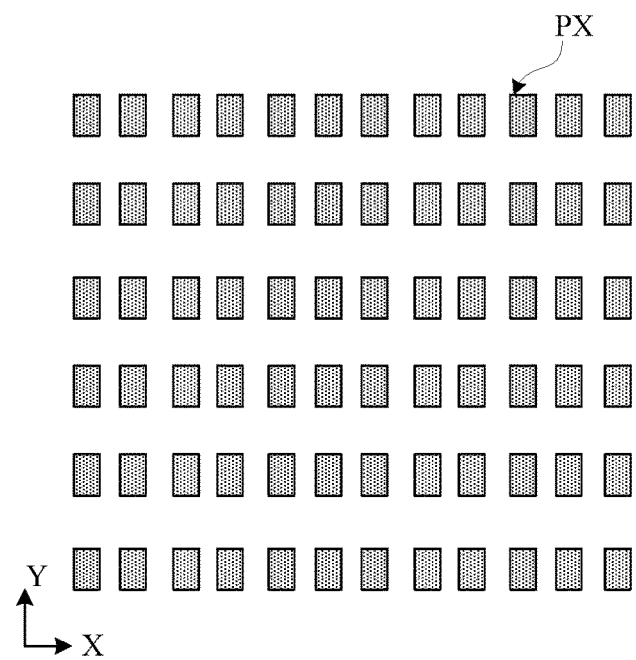
FIG. 3 is a schematic diagram of a partial layout of pixel circuits of a display substrate according to at least one embodiment of the present disclosure.

FIG. 3 is a schematic diagram of a partial layout of pixel circuits of a display substrate according to at least one embodiment of the present disclosure. In some exemplary implementations as shown in FIG. 3, a plurality of pixel circuits (PXs) of the circuit structure layer may be arranged in an array in a display area AA. A plurality of pixel circuits (PXs) arranged in the first direction X are in one pixel circuit row, and a plurality of pixel circuits (PXs) arranged in the second direction Y are in one pixel circuit column. A spacing between adjacent pixel circuit rows may be greater than a spacing between adjacent pixel circuit columns, so as to provide a layout space for the first gate drive circuit and the second gate drive circuit in the display area AA. In the display area AA, the spacing between adjacent pixel circuit rows may be substantially the same to ensure the uniformity of the arrangement of pixel circuits within the display area AA. In some examples, a plurality of first gate drive units and a plurality of second gate drive units may be respectively arranged between adjacent pixel circuit rows. However, this embodiment is not limited thereto.

In some exemplary implementations, the Pixel Circuit (PX) in the circuit structure layer may be of a 3T1C (i.e. three transistors and one capacitor) configuration, a 5T1C (i.e. five transistors and one capacitor) configuration, a 6T1C (i.e. six transistors and one capacitor) configuration, or a 7T1C (i.e. seven transistors and one capacitor) configuration. In some examples, when the Pixel Circuit (PX) is of a 3T1C configuration, the first circuit area and the second circuit area may each include a gate drive circuit, for example, the first gate drive circuit and the second gate drive circuit may both be scan drive circuits to provide scan signals to a plurality of pixel circuits. In some examples, when the Pixel Circuit (PX) is of a 7T1C structure, the first circuit area and the second circuit area may each include two gate drive circuits, for example, the two first gate drive circuits may be a scan drive circuit and a light emitting drive circuit, and the two second gate drive circuits may be a scan drive circuit and a light emitting drive circuit, which provide a scan signal, a reset signal, and a light emitting control signal to a plurality of pixel circuits. However, this embodiment is not limited thereto.

Figure 4:
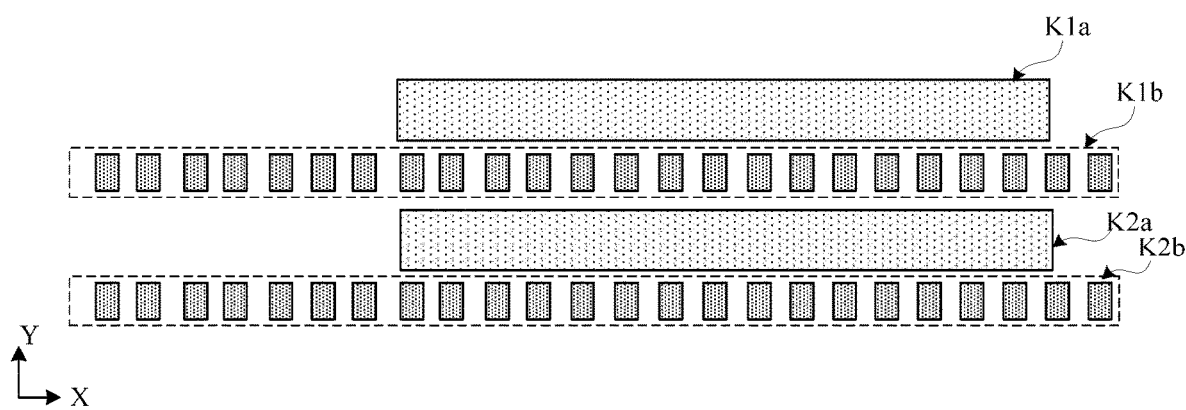
FIG. 4 is a partial schematic diagram of a region S1 in FIG. 1.

FIG. 4 is a partial schematic diagram of a region S1 in FIG. 1. FIG. 4 illustrates a partial configuration of a first circuit area Q1*a*. In some exemplary implementations as shown in FIG. 4, a plurality of pixel circuit rows and a plurality of cascaded first gate drive units may be arranged at intervals in a first circuit area Q1*a* in a second direction Y. For example, in the second direction Y, a first gate drive unit K1*a* in an i-stage, a pixel circuit K1*b* in an i-th row, a first gate drive unit K2*a* in an (i+1)-th stage, and a pixel circuit K2*b* in an (i+1)-th row are arranged in sequence. An output terminal of the first gate drive unit K1*a* in the i-th stage may be electrically connected with an input terminal of the first gate drive unit K2*a* in the (i+1)-th stage. The first gate drive unit K1*a* in the i-th stage may provide a gate control signal to the pixel circuit K1*b* in an i-th row, and the first gate drive unit K2*b* in the (i+1)-th stage may provide a gate control signal to the pixel circuit K2*b* in the (i+1)-th row. However, this embodiment is not limited thereto.

In some exemplary implementations, the first gate drive circuit and the second gate drive circuit may be formed together with the pixel circuits in a process of forming a pixel circuit. For example, the transistors of the pixel circuit and the gate drive circuit may be P-type transistors or may be N-type transistors. Use of a same type of transistors in the pixel circuit and the gate drive circuit may simplify a process flow, reduce process difficulties in a display panel, and improve a product yield. In some possible embodiments, the pixel circuit and the gate drive circuit may include P-type transistors and N-type transistors. However, this embodiment is not limited thereto.

Figure 5:
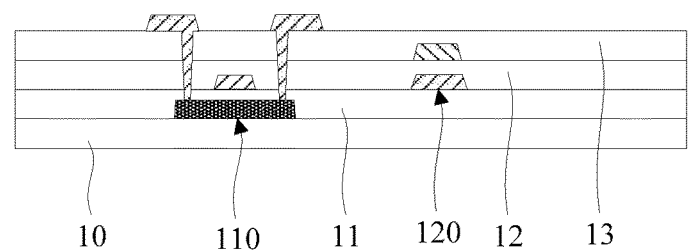
FIG. 5 is a schematic diagram of a partial section of a circuit structure layer according to at least one embodiment of the present disclosure.

FIG. 5 is a schematic diagram of a partial section of a circuit structure layer according to at least one embodiment of the present disclosure. In FIG. 5, a structure with a transistor 110 and a capacitor 120 are taken as an example for illustration. The transistor 110 and the capacitor 120 may be transistors and capacitors included in the pixel circuit or the gate drive unit. This embodiment is not limited thereto.

In some exemplary implementations as shown in FIG. 5, in a plane perpendicular to the display substrate, the circuit structure layer may include a semiconductor layer, a first conductive layer, a second conductive layer, and a third conductive layer disposed on the underlayer substrate 10. A first insulating layer 11 is provided between the semiconductor layer and the first conductive layer, a second insulating layer 12 is provided between the first conductive layer and the second conductive layer, and a third insulating layer 13 is provided between the second conductive layer and the third conductive layer. The first to third insulating layers 11 to 13 may be inorganic insulating layers.

In some exemplary implementations, the underlayer substrate 10 may be a flexible substrate or a rigid substrate. The semiconductor layer at least includes an active layer of the transistor 110. The first conductive layer includes, at least, a gate of the transistor 110 and a first electrode of the capacitor 120. The second conductive layer includes, at least, a second electrode of the capacitor 120. The third conductive layer includes, at least, first and second electrodes of the transistor 110. However, this embodiment is not limited thereto. For example, the third conductive layer may also include a data line and a power line, and the first conductive layer or the second conductive layer may include a gate line.

In some exemplary implementations, a fourth insulating layer, a light emitting structure layer and an encapsulating layer may be sequentially disposed on a side of the third conductive layer away from the underlayer substrate 10. The light emitting structure layer may include a plurality of light emitting elements, wherein at least one light emitting element may include an anode, a cathode, and an organic light emitting layer disposed between the anode and the cathode. The light emitting element is configured to emit light of a corresponding brightness in response to a current output by an electrically connected pixel circuit. For example, the anode of the light emitting element may be electrically connected to the pixel circuit through a via provided on the fourth insulating layer, the organic light emitting layer may be in direct contact with the anode, and the cathode may be in direct contact with the organic light emitting layer. The organic light emitting layer of the light emitting element is driven by the anode and the cathode to emit light of a corresponding color. The encapsulation layer may include a first encapsulation layer, a second encapsulation layer, and a third encapsulation layer that are stacked, wherein the first encapsulation layer and the third encapsulation layer may be made of an inorganic material, the second encapsulation layer may be made of an organic material, and the second encapsulation layer is disposed between the first encapsulation layer and the third encapsulation layer to ensure that surrounding water vapor cannot enter the light emitting structure layer. However, this embodiment is not limited thereto. In some examples, the circuit structure layer further includes a fourth conductive layer located on a side of the third conductive layer away from the underlayer substrate, and the fourth conductive layer may include a connection electrode that may electrically connect the third conductive layer and an anode of the light emitting element.

In some exemplary implementation modes, the organic light emitting layer may include a Hole Injection Layer (HIL), a Hole Transport Layer (HTL), an Electron Block Layer (EBL), Emitting Layer (EML), a Hole Block Layer (HBL), an Electron Transport Layer (ETL), and an Electron Injection Layer (EIL) which are stacked. In some exemplary implementations, hole injection layers of all light emitting elements may be connected together to form a common layer, electron injection layers of all the light emitting elements may be connected together to form a common layer, hole transport layers of all the light emitting elements may be connected together to form a common layer, electron transport layers of all the light emitting elements may be connected together to form a common layer, hole block layers of all the light emitting elements may be connected together to form a common layer, emitting layers of adjacent light emitting elements may be overlapped slightly or may be isolated from each other, and electron block layers of adjacent light emitting elements may be overlapped slightly or may be isolated from each other.

In some exemplary implementations, the light emitting structure layer may include a red light emitting element, a green light emitting element and a blue light emitting element; or may include a red light emitting element, a green light emitting element, a blue light emitting element and a white light emitting element, which are not limited herein in the present disclosure. In some exemplary implementations, a shape of a light emitting element may be a rectangle, a rhombus, a pentagon, or a hexagon. For example, in a case where one pixel unit includes three light emitting elements emitting three different colors respectively, the three light emitting elements may be arranged in parallel in a horizontal direction, in parallel in a vertical direction, or in a form of triangle. In a case where one pixel unit includes four light emitting elements, and the four light emitting elements may be arranged in parallel in a horizontal direction, in parallel in a vertical direction, or in a form of square, which is not limited in the present disclosure.

In some exemplary implementations, the first connection line area B1 may include a plurality of first display signal lines. The plurality of first signal lines may include a cascaded signal line between a first gate drive circuit within the first circuit area and a second gate drive circuit within the second circuit area, and a signal line common to the first gate drive circuit and the second gate drive circuit (e.g., a clock signal line, a power supply signal line).

Figure 6:
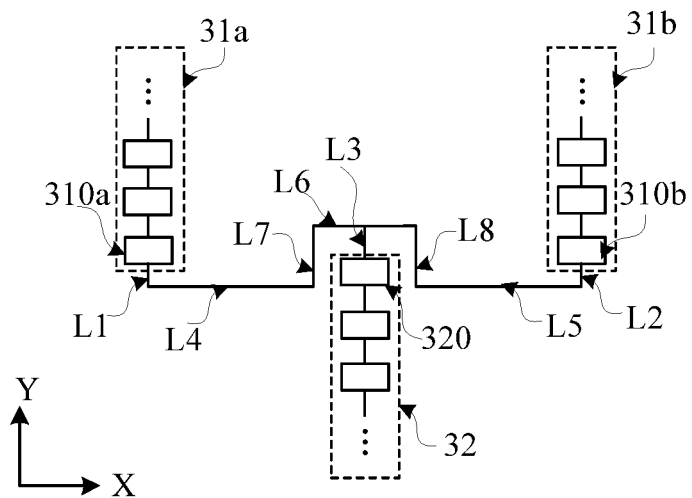
FIG. 6 is a schematic diagram of the wiring of a first connection line area according to at least one embodiment of the present disclosure.

FIG. 6 is a schematic diagram of the wiring of a first connection line area according to at least one embodiment of the present disclosure. FIG. 6 shows a first signal line which is taken as a cascaded signal line. In some exemplary implementations as shown in FIG. 6, a cascaded signal line may include two first sub-signal lines L1 and L2 and a second sub-signal line L3. The first sub-signal line L1 is electrically connected to a first gate drive circuit 31a within a first circuit area, the another first sub-signal line L2 is electrically connected to a first gate drive circuit 31b within another first circuit area, and the second sub-signal line L3 is electrically connected to a second gate drive circuit 32 within a second circuit area. The first sub-signal line L1 is configured to transmit a first cascaded signal provided by the first gate drive circuit 31a within the first circuit area (for example, a gate control signal output by a first gate drive unit 310a in a last stage of the first gate drive circuit 31a), the first sub-signal line L2 is configured to transmit a second cascaded signal provided by the first gate drive circuit 31b of the another first circuit area (for example, a gate control signal output by a first gate drive unit 310b in a last stage of the first gate drive circuit 31b), and the second sub-signal line L3 is configured to receive the first cascaded signal and the second cascaded signal. A second gate drive unit 320 in a first stage of the second gate drive circuit 32 may output a gate control signal when the first cascaded signal and the second cascaded signal received by the second sub-signal line L3 coincide.

In some exemplary implementations as shown in FIG. 6, all of the first sub-signal lines L1 and L2 and the second sub-signal line L3 extend in the second direction Y. The first sub-signal line L1 and the second sub-signal line L3 are electrically connected by two first connection lines L4 and L6, and the first sub-signal line L2 and the second sub-signal line L3 are electrically connected by two first connection lines L5 and L6. All of the first connection lines L4, L5 and L6 extend in the first direction X. Two first connection lines L4 and L6 are electrically connected by a first jumper line L7, and two first connection lines L5 and L6 are electrically connected by a first jumper line L8. Both of the first jumper lines L7 and L8 extend in the second direction Y. However, this embodiment is not limited thereto. For example, a first sub-signal line and a second sub-signal line may be electrically connected by a first connection line.

In some exemplary implementations, the first cascaded signal is transmitted from the first gate drive circuit 31a to the second gate drive circuit 32 by the first sub-signal line L1, the first connection line L4, the first jumper line L7, the first connection line L6 and the second sub-signal line L3, and the second cascaded signal is transmitted from the first gate drive circuit 31b to the second gate drive circuit 32 by the first sub-signal line L2, the first connection line L5, the first jumper line L8, the first connection line L6, and the second sub-signal line L3. The impedance of signal lines (including the first sub-signal line L1, the first connection line L4, the first jumper line L7, the first connection line L6, and the second sub-signal line L3 connected in sequence) for transmitting the first cascaded signal may be substantially the same as the impedance of the signal lines (including the first sub-signal line L2, the first connection line L5, the first jumper line L8, the first connection line L6, and the second sub-signal line L3 connected in sequence) for transmitting the second cascaded signal. In this way, the consistency of the first cascaded signal and the second cascaded signal can be maintained, make sure that the second gate drive circuit receives normal cascaded signal.

Figure 7:
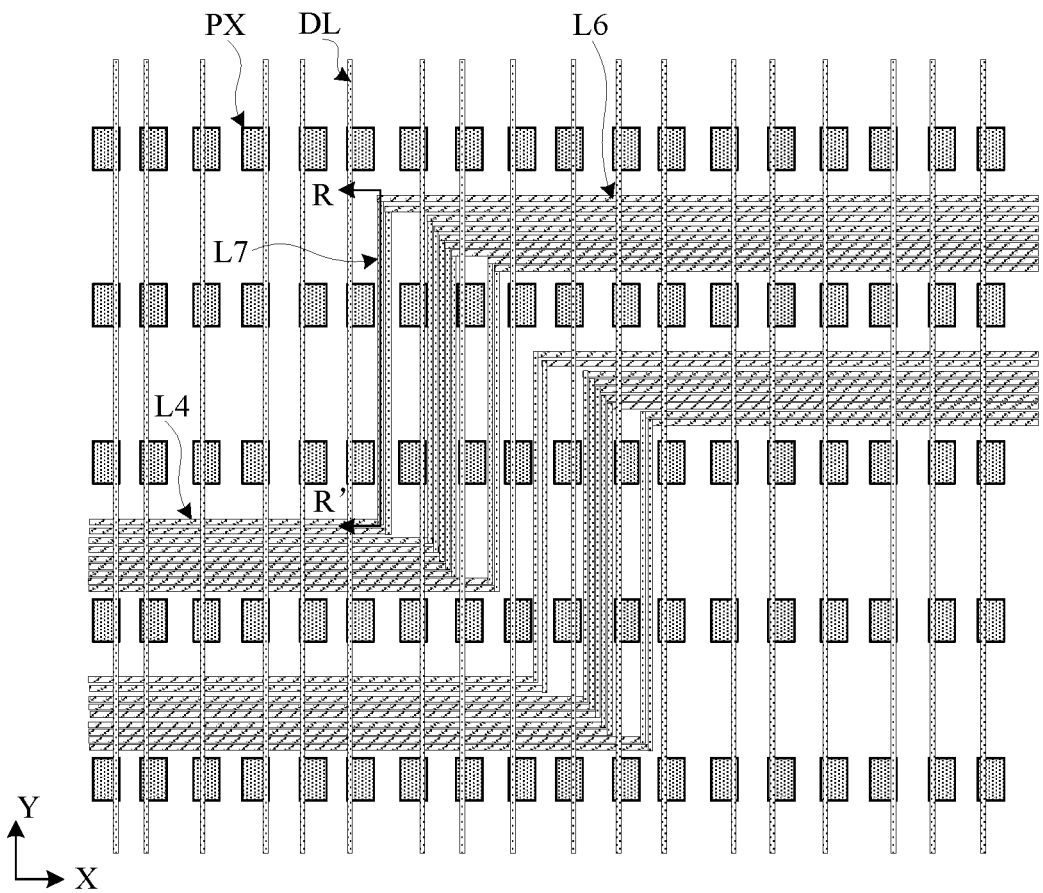
FIG. 7 is a partial schematic diagram of a region S2 in FIG. 1.
Figure 8:
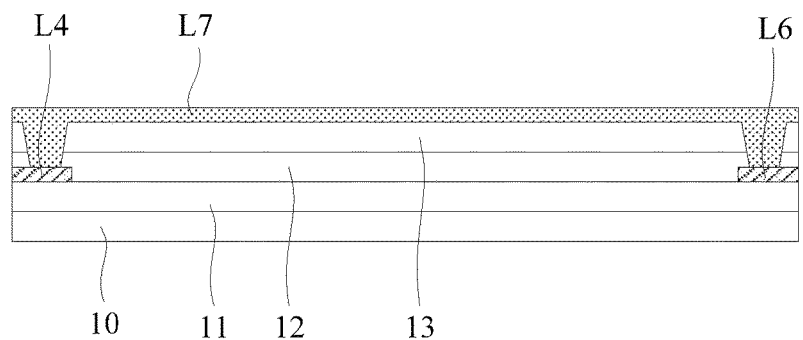
FIG. 8 is a schematic partial sectional view along an R-R' direction in FIG. 7.

FIG. 7 is a partial schematic diagram of a region S2 in FIG. 1. FIG. 8 is a schematic partial sectional view along an R-R' direction in FIG. 7. In some exemplary implementations, a first connection line region B1 may include a plurality of first display signal lines. The plurality of first signal lines may include a cascaded signal line, a clock signal line, a first power supply line, and a second power supply line. In this example, the arrangement and connection of the plurality of first signal lines may be substantially the same. However, this embodiment is not limited thereto.

In some exemplary implementations, as shown in FIGS. 6 and 7, in the first connection line area B1, each of the first signal lines may include a first sub-signal line electrically connected to the first gate drive circuit and a second sub-signal line electrically connected to the second gate drive circuit. The first sub-signal lines and the second sub-signal lines may be electrically connected by two first connection lines extending in the first direction X and one first jumper line extending in the second direction Y. Taking a cascaded signal line as an example, one end of the first connection line L4 can be electrically connected with the first sub-signal line, another end can be electrically connected with one end of the first jumper line L7, the other end of the first jumper line L7 can be electrically connected with the first connection line L6, and the first connection line L6 can be electrically connected with the second sub-signal line, thereby achieving a transmission path of the first cascaded signal. In this example, at least two first connection lines transmitting a same signal are misaligned in the second direction Y. Two first connection lines transmitting the same signal can be electrically connected by a first jumper line.

In some exemplary implementations as shown in FIGS. 6 and 7, a plurality of first jumper lines transmitting different signals may be parallel to each other and sequentially arranged between adjacent pixel circuit columns in the first direction X. For example, a plurality of first jumper lines may be arranged between adjacent pixel circuit columns. Quantities of first jumper lines arranged between different adjacent pixel circuit columns may be different. For example, m pieces of first jumper lines are arranged between a pixel circuit in a j-th column and a pixel circuit in a (j+1)-th column, and n pieces of first jumper lines are arranged between a pixel circuit in a (j+1)-th column and a pixel circuit in a (j+2)-th column, wherein the n and the m are different integers. However, this embodiment is not limited thereto. For example, the quantities of first jumper lines arranged between different adjacent pixel circuit columns may be the same.

In some exemplary implementations as shown in FIG. 7, the first jumper line L7 may span two rows of Pixel Circuits (PXs) in the second direction Y. That is, two rows of pixel circuits are provided between the first connection lines L4 and L6 to which the first jumper line L7 is electrically connected. However, this embodiment is not limited thereto. For example, the first jumper line may span three or more rows of pixel circuits in the second direction.

In some exemplary implementations as shown in FIG. 7, the display area is provided with a plurality of Data Lines (Dls) extending in the second direction Y. A Data Line (DL) may be electrically connected to a column of Pixel Circuits (PXs) and configured to supply a data signal to the Pixel Circuits (PXs). The plurality of first jumper lines may be arranged on the same layer as the Data Line (DL). The plurality of first jumper lines may be arranged between the plurality of adjacent Data Lines (DLs). Numbers of first jumper lines arranged between different adjacent Data Lines (DL) may be different. However, this embodiment is not limited thereto.

In some exemplary implementations as shown in FIG. 7, a plurality of first connection lines transmitting different signals may be parallel to each other and sequentially arranged between adjacent pixel circuit rows in the second direction Y. For example, a plurality of first connection lines may be arranged between adjacent pixel circuit rows. The quantities of first connection lines arranged between different adjacent pixel circuit rows may be the same. For example, d pieces of first connection lines are arranged between a pixel circuit in an i-th row and a pixel circuit in an (i+1)-th row, and d pieces of first connection lines are arranged between a pixel circuit in an (i+1)-th row and a pixel circuit in an (i+2)-th row, wherein the d is an integer. However, this embodiment is not limited thereto. For example, the quantity of first connection lines arranged between different adjacent pixel circuit rows may be different.

In some exemplary implementations, as shown in FIGS. 5 and 8, a plurality of first connection lines (e.g., first connection lines L4 and L6) extending in the first direction X may be located in the first conductive layer in a plane perpendicular to the display substrate. A plurality of first jumper lines (e.g. the first jumper line L7) extending in the second direction Y may be located in the third conductive layer. For example, one end of the first jumper L7 may be electrically connected to one end of the first connection line L4 through a via opened in the third insulating layer 13 and the second insulating layer 12, and another end of the first jumper L7 may be electrically connected to one end of the first connection line L6 through another via opened in the third insulating layer 13 and the second insulating layer 12. However, this embodiment is not limited thereto. For example, a plurality of first connection lines may be located in the second conductive layer.

In some exemplary implementations, a data line is located in the third conductive layer, and the data line and the first jumper line may be arranged in a same layer. A gate line electrically connecting the gate drive unit and the pixel circuit may be disposed in the same layer as the first connection line, for example, the gate line may be located in the first conductive layer or the second conductive layer. However, this embodiment is not limited thereto.

In some exemplary implementations, within the display area AA, a plurality of gate lines extending in the first direction X may be located in the first conductive layer or the second conductive layer, a plurality of data lines and power lines extending along the second direction Y can be located in the third conductive layer. By disposing a first connection line extending along the first direction X in the first conductive layer or the second conductive layer, and disposing a first jumper line extending along the second direction Y in the third conductive layer, a wiring arrangement can be facilitated and a design of intersected signal lines in a same layer can be avoided. However, this embodiment is not limited thereto.

In the exemplary implementation, a gate drive circuit provided within the display area is arranged in a segmented manner, and a driving mode of the pixel circuit in the display area is a mixed driving mode from a left and right separate driving to a joint driving, which can be applied to an abnormal cut display substrate with a peculiar structure, thereby supporting the realization of an abnormal cut display product with a narrow bezel.

Figure 9:
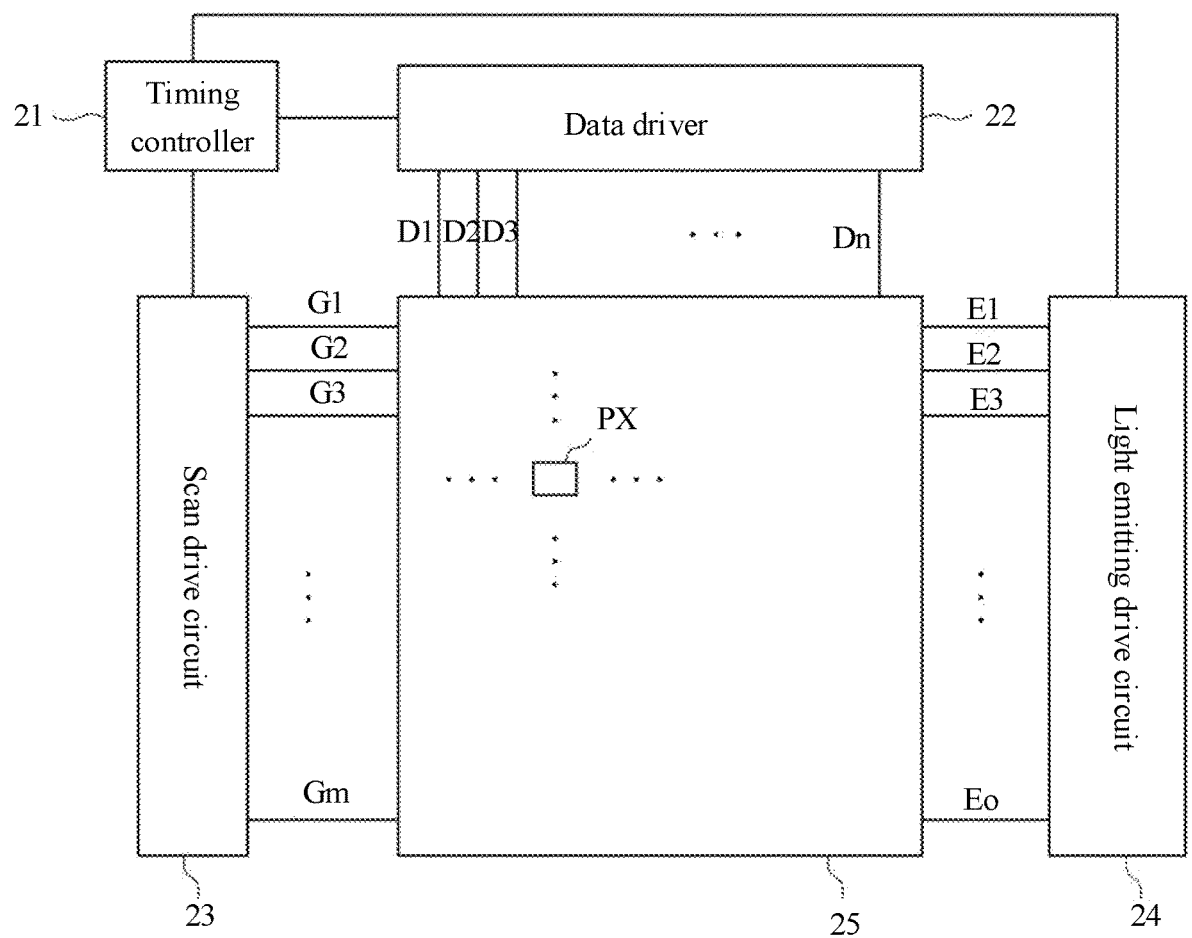
FIG. 9 is a schematic diagram of a structure of a display substrate according to at least one embodiment of the present disclosure.

FIG. 9 is a schematic diagram of a structure of a display substrate according to at least one embodiment of the present disclosure. In some exemplary implementations as shown in FIG. 9, a display substrate may include a timing controller 21, a data driver 22, a gate driver circuit array and a pixel circuit array 25. The gate drive circuit array may include a first gate drive circuit array and a second gate drive circuit array. The first gate drive circuit array and the second gate drive circuit array may each include a scan drive circuit 23 and a light emitting drive circuit 24. The pixel circuit array 25 may include a plurality of Pixel Circuits (PXs) arranged in an array. In some examples, the scan drive circuit 23 is configured to provide a scan signal and a reset signal to a plurality of Pixel Circuits (PXs) and the light emitting drive circuit 24 is configured to provide a light emitting control signal to a plurality of Pixel Circuits (PXs).

In some exemplary implementations, the timing controller 21 may provide a gray-scale value and a control signal suitable for a specification of the data driver 22 to the data driver 22, provide a clock signal, a scanning start signal, etc., suitable for a specification of the scan drive circuit 23 to the scan drive circuit 23, and provide a clock signal, a light emitting start signal, etc., suitable for a specification of the light emitting drive circuit 24 to the light emitting drive circuit 24. The data driver 22 may generate data voltages to be provided to the data lines D1, D2, D3 . . . and Dn using gray scale values and control signals received from the timing controller 21. For example, the data driver 22 may sample the gray-scale value using the clock signal and apply the data voltage corresponding to the gray-scale value to the data lines D1 to Dn by taking a pixel circuit row as a unit, where the n may be a natural number. The scan drive circuit 23 may generate scan signals to be provided to the scanning lines S1, S2, S3 . . . and Sm by receiving the clock signal, the scan start signal, and the like from the timing controller 21. For example, the scan drive circuit 23 may sequentially provide the scan signals with on-level pulses to the scanning lines S1 to Sm. For example, the scan drive circuit 23 may be constructed in a form of a shift register and may generate a scan signal in such a manner as to transmit sequentially the scan start signal provided in a form of a turn-on level pulse to a next-stage circuit under the control of the clock signal, wherein the m may be a natural number. The light emitting drive circuit 24 may receive the clock signal, the light emitting start signal, etc., from the timing controller 21 to generate a light emitting control signal to be provided to light emitting signal lines E1, E2, E3, . . . and Eo. For example, the light emitting drive circuit 24 may be constructed in a form of a shift register, and may generate the light emitting control signal in such a manner as to sequentially transmit a light emitting control signal provided in form of the cut-off level pulse to a next-stage circuit under the control of the clock signal. Herein, the o may be a natural number.

In some exemplary implementations, the pixel circuit may be of a 7T1C configuration. The first circuit area Q1a may include a first gate drive circuit array (including two first gate drive circuits, for example, the two first gate drive circuits may be a first scan drive circuit and a first light emitting drive circuit). The first circuit area Q1b may include a first gate drive circuit array (including two first gate drive circuits, for example, the two first gate drive circuits may be a first scan drive circuit and a first light emitting drive circuit). The second circuit area Q2 may include a second gate drive circuit array (including two second gate drive circuits, for example, the two second gate drive circuits may be a second scan drive circuit and a second light emitting drive circuit). The first scan drive circuit may include a plurality of cascaded first scan drive units, the first light emitting drive circuit may include a plurality of cascaded first light emitting drive units, the second scan drive circuit may include a plurality of cascaded second scan drive units, and the second light emitting drive circuit may include a plurality of cascaded second light emitting drive units. For example, the first scan drive circuit within the first circuit area Q1a may be cascaded with the second scan drive circuit within the second circuit area Q2, and the first scan drive circuit within the first circuit area Q1b may be cascaded with the second scan drive circuit within the second circuit area Q2; the first light emitting drive circuit within the first circuit area Q1a may be cascaded with the second light emitting drive circuit within the second circuit area Q2, and the first light emitting drive circuit within the first circuit area Q1b may be cascaded with the second light emitting drive circuit within the second circuit area Q2. In some examples, the impedance of a signal line for transmitting a cascaded signal between the first scan drive circuit within the first circuit area Q1a and the second scan drive circuit within the second circuit area Q2 may be substantially the same as the impedance of a signal line for transmitting a cascaded signal between the first scan drive circuit within the first circuit area Q1b and the second scan drive circuit within the second circuit area Q2. The impedance of a signal line for transmitting a cascaded signal between the first light emitting drive circuit within the first circuit area Q1a and a second light emitting drive circuit within the second circuit area Q2 may be substantially the same as the impedance of a signal line for transmitting a cascaded signal between the first light emitting drive circuit within the first circuit area Q1b and the second light emitting drive circuit within the second circuit area Q2. Thus, the cascaded signals outputted by the two first scan drive circuits can be synchronized, the second scan drive circuit can output a normal scan signal, the cascaded signals outputted by the two first light emitting drive circuits can be synchronized, and the second light emitting drive circuit can output a normal light emitting control signal.

In some exemplary implementations, the first scan drive circuit may include a plurality of cascaded first scan drive units and the second scan drive circuit may include a plurality of cascaded second scan drive units. The first light emitting drive circuit may include a plurality of cascaded first light emitting drive units, and the second light emitting drive circuit may include a plurality of cascaded second light emitting drive units. The circuit structures of the first scan drive unit and the second scan drive unit may be the same, the circuit structures of the first light emitting drive unit and the second light emitting drive unit may be the same, and the circuit structures of the first scan drive unit and the first light emitting drive unit may be different. In some examples the first scan drive unit, the second scan drive unit, the first light emitting drive unit and the second light emitting drive unit may each include a plurality of transistors and capacitors. However, this embodiment is not limited thereto.

In some exemplary implementations, because a heart-shaped display area AA is substantially symmetrical about the center line in the first direction X, the structures of the first gate drive circuit arrays within the two first circuit areas may be substantially the same, and consistent cascaded signals transmitted to the second gate drive circuit arrays may be maintained by arranging impedance loads of the signal lines for transmitting the cascaded signals to be consistent, so that the second gate drive circuit arrays work normally.

Figure 10:
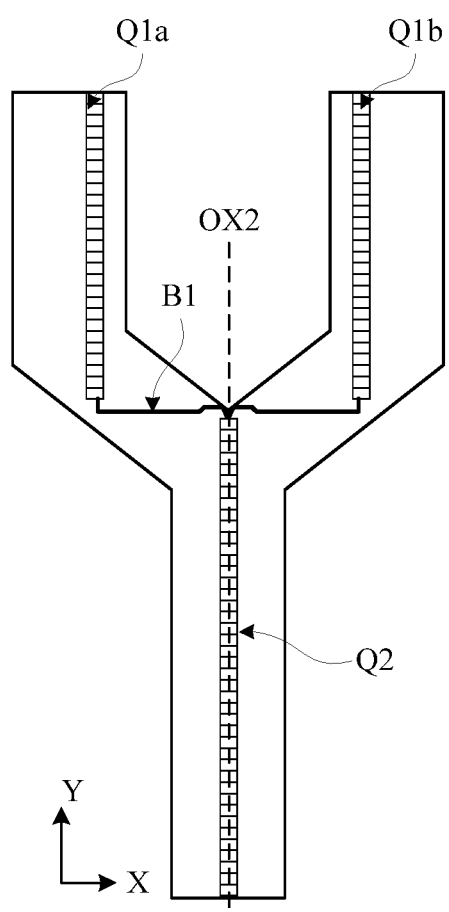
FIG. 10 is another schematic diagram of a display substrate according to at least one embodiment of the present disclosure.

FIG. 10 is another schematic diagram of a display substrate according to at least one embodiment of the present disclosure. In some exemplary implementations as shown in FIG. 10, the display area in this embodiment may be a letter Y-shaped. The display area may be substantially symmetrical about the second center line OX2 in the first direction X. The circuit structure layer may include two first circuit areas Q1a and Q1b, a first connection line area B1 and a second circuit area Q2. For example, the first gate drive circuit within the first circuit area Q1a may provide a gate drive signal to pixel circuits in s rows within an upper left part area of the display area, the first gate drive circuit of the first circuit area Q1b may provide the gate drive signal to the pixel circuits in s rows within the upper right part area of the display area, and the second gate drive circuit within the second circuit area Q2 may provide the gate drive signal to the pixel circuits in a t-th row to an s-th rows within the lower half area of the display area. Wherein the t and the s are natural numbers, and t is greater than s.

The configurations of the first circuit area, the first connection line area and the second circuit area according to the present embodiment can be described with reference to the foregoing embodiments, which are not repeated herein again. The structure (or method) shown in this embodiment may be combined with structures (or methods) shown in other embodiments as appropriate.

Figure 11:
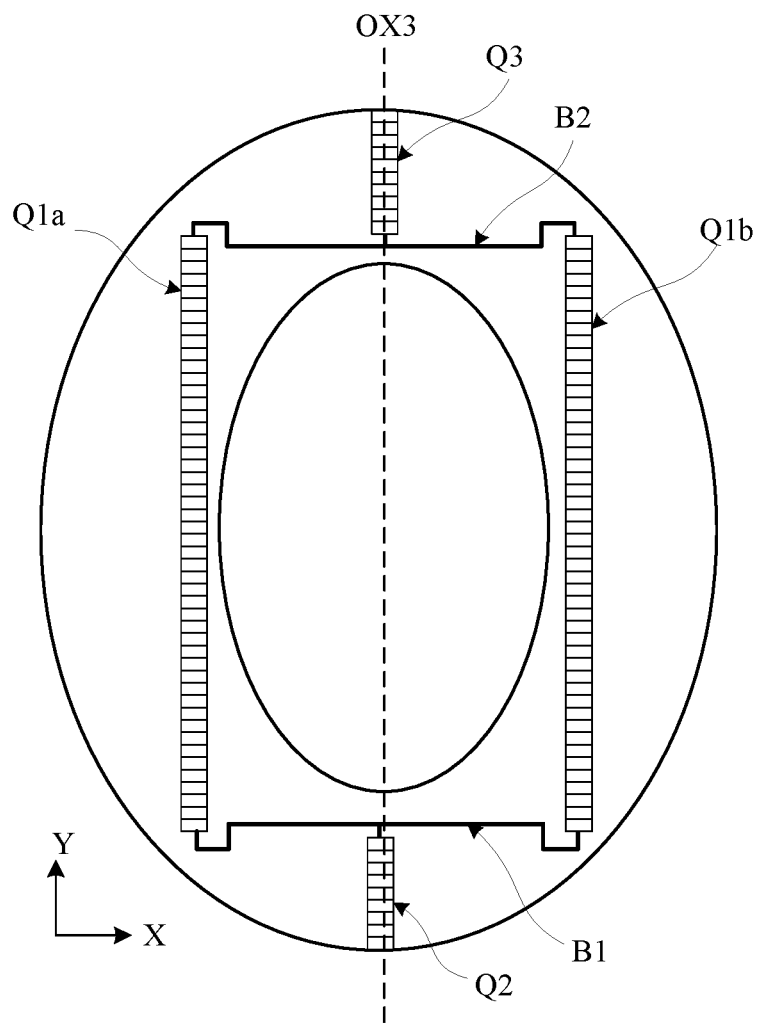
FIG. 11 is another schematic diagram of a display substrate according to at least one embodiment of the present disclosure.

FIG. 11 is another schematic diagram of a display substrate according to at least one embodiment of the present disclosure. In some exemplary implementations as shown in FIG. 11, a display area in this embodiment may be annular. The display area may be substantially symmetrical about a third center line OX3 in the first direction X. The circuit structure layer may include two first circuit areas Q1a and Q1b, a second circuit area Q2, a third circuit area Q3, a first connection line area B1 and a second connection line region B2. The circuit structures of the first gate drive circuits of the two first circuit areas Q1a and Q1b may be substantially the same and configured to drive a same number of pixel circuit rows.

In some exemplary implementations, in the second direction Y, the second circuit area Q2 is located on a side of the two first circuit areas Q1a and Q1b, and the third circuit area Q3 is located on a side of the two first circuit areas Q1a and Q1b away from the second circuit area Q2. That is the second circuit area Q2 and the third circuit area Q3 are located on opposite sides of the two first circuit areas Q1a and Q1b in the second direction Y. The first connection line area B1 is located on a side of the second circuit area Q2 near the two first circuit areas Q1a and Q1b, and the second connection line area B2 is located on a side of the third circuit area Q3 near the two first circuit areas Q1a and Q1b.

In the first direction X, two first circuit areas Q1a and Q1b are arranged in sequence. In the first direction X, the second circuit area Q2 is misaligned from the two first circuit areas Q1a and Q1b, and the third circuit area Q3 is misaligned from the two first circuit areas Q1a and Q1b.

In some exemplary implementations, each of first circuit areas Q1a and Q1b may include at least one first gate drive circuit. The second circuit area Q2 may include at least one second gate drive circuit. The third circuit area Q3 may include at least one third gate drive circuit. In some examples the structures of the two first gate drive circuits within the first circuit areas Q1a and Q1b may be substantially the same. A quantity of pixel circuit rows driven by the second gate drive circuit within the second circuit area Q2 may be substantially the same as a quantity of pixel circuit rows driven by the third gate drive circuit within the third circuit area Q3. However, this embodiment is not limited thereto.

In some exemplary implementations, the first gate drive circuits within the two first circuit areas Q1a and Q1b are each cascaded with the second gate drive circuit within the second circuit area Q2, and the first gate drive circuits within the two first circuit areas Q1a and Q1b are also cascaded with the third gate drive circuit within the third circuit area Q3. For example, the third gate drive circuit within the third circuit area Q3 provides a third cascaded signal to the first gate drive circuits within the first circuit areas Q1a and Q1b, the first gate drive circuit of the first circuit area Q1a provides a first cascaded signal to the second gate drive circuit of the second circuit area Q2, the first gate drive circuit of the first circuit area Q1b provides a second cascaded signal to the second gate drive circuit of the second circuit area Q2, and the second gate drive circuit of the second circuit area Q2 outputs a gate control signal to a corresponding pixel circuit after receiving the first cascaded signal and the second cascaded signal which are consistent.

In some exemplary implementations, the second gate drive circuit within the second circuit area Q2 and the third gate drive circuit within the third circuit area Q3 may provide gate drive signals to pixel circuits in a plurality of rows within both end regions of the display area. The first gate drive circuits within the two first circuit areas Q1a and Q1b may provide gate drive signals to the pixel circuits in the plurality of rows in the intermediate region of the display area. In some examples, the second gate drive circuit and the third gate drive circuit may each be located in an intermediate region of an end region of the display area. However, this embodiment is not limited thereto.

In some exemplary implementations, the structure of the third gate drive circuit may refer to the structure of the second gate drive circuit, and a wiring mode of the second connection line area B2 may refer to a wiring mode of the first connection line area B1, which is not repeated here again.

The structures of the circuit structure layers in this embodiment may be referred to the descriptions of the above embodiments and will not be further illustrated here. The structure (or method) shown in this embodiment may be combined with structures (or methods) shown in other embodiments as appropriate.

Figure 12:
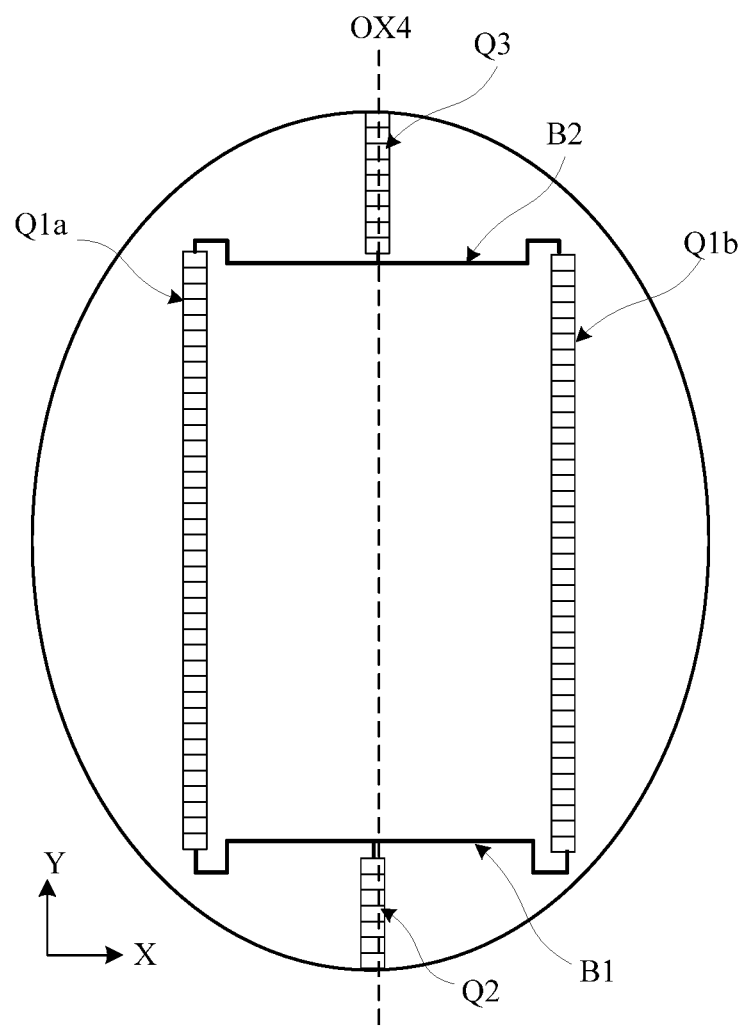
FIG. 12 is another schematic diagram of a display substrate according to at least one embodiment of the present disclosure.

FIG. 12 is another schematic diagram of a display substrate according to at least one embodiment of the present disclosure. In some exemplary implementations as shown in FIG. 12, a display area in this embodiment may be elliptical. The display area may be substantially symmetrical about a fourth center line OX4 in the first direction X. The circuit structure layer may include two first circuit areas Q1a and Q1b, a second circuit area Q2, a third circuit area Q3, a first connection line area B1 and a second connection line region B2. The circuit structures of the first gate drive circuits of the two first circuit areas Q1a and Q1b may be substantially the same and configured to drive a same number of pixel circuit rows.

In some exemplary implementations, in the second direction Y, quantities of pixel circuits in a plurality of rows are different, for example, the quantity of pixel circuits in each row within both end region is smaller than the quantity of pixel circuits in each row in the intermediate region. In this embodiment, two gate drive circuits are separately disposed in the intermediate region of the display area, and only one gate drive circuit is disposed in the two end regions of the display area, which can meet the load requirements of different areas.

Other structures of circuit structure layer in this embodiment may be referred to the descriptions of the above embodiments and are not repeated here again. The structure (or method) shown in this embodiment may be combined with structures (or methods) shown in other embodiments as appropriate.

Figure 13:
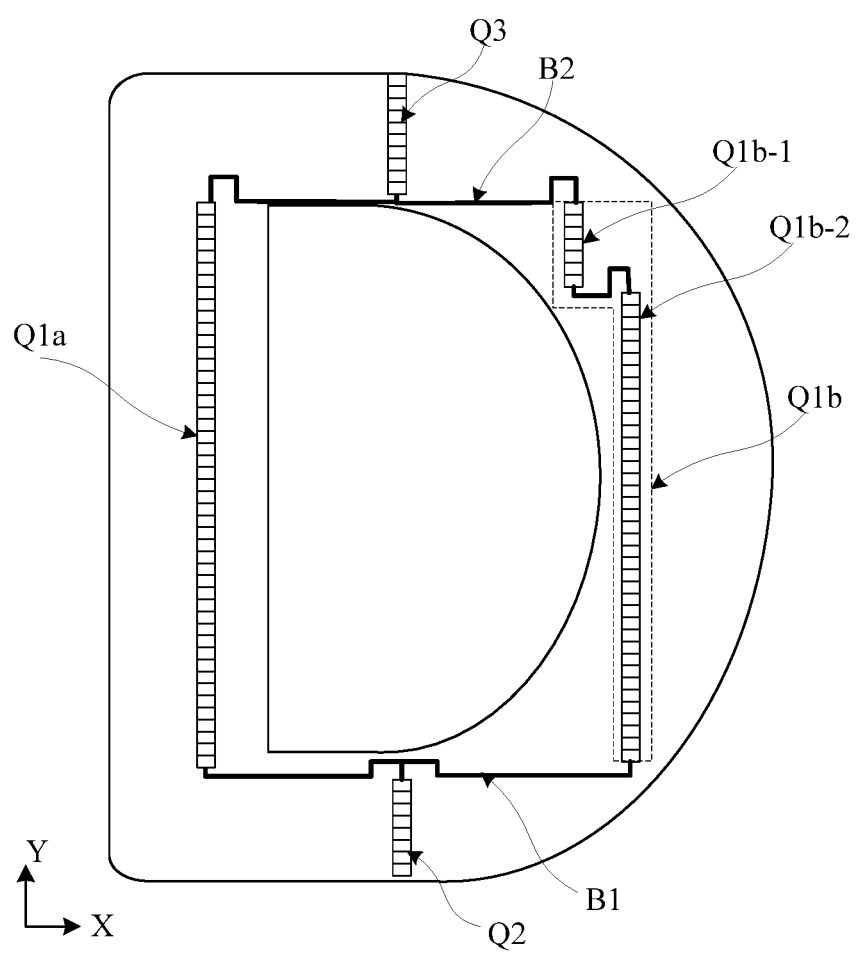
FIG. 13 is another schematic diagram of a display substrate according to at least one embodiment of the present disclosure.

FIG. 13 is another schematic diagram of a display substrate according to at least one embodiment of the present disclosure. In some exemplary implementations as shown in FIG. 13, a display area may be a letter D-shaped. The display area is asymmetrical in the first direction X. The circuit structure layer may include two first circuit areas Q1a and Q1b, a second circuit area Q2, a third circuit area Q3, a first connection line area B1 and a second connection line region B2.

In some exemplary implementations, drive loads of the first gate drive circuits within the two first circuit areas Q1a and Q1b differ. For example, a difference between a quantity of pixel circuits in the pixel circuit row driven by the first gate drive circuit within the first circuit area Q1b and a quantity of pixel circuits in the pixel circuit row driven by the first gate drive circuit within the first circuit area Q1a is greater than a threshold value. An aspect ratio of the output transistor of the first gate drive unit of the first gate drive circuit within the first circuit areas Q1a and Q1b may be different. Wherein, the aspect ratio of the transistor refers to a ratio of a width to a length of conductive channel of the transistor, that is, W/L. The width of the conductive channel may be a dimension perpendicular to the extension direction, and the length of the conductive channel may be a dimension in the extension direction. In general, the greater the aspect ratio of the transistor, the greater the driving capacity, that is, the ability to drive load, and the greater a driving current flowing through the transistor. The aspect ratio of the output transistor is positively correlated with a quantity of pixel circuits in each row driven by the first gate drive circuit. That is, the aspect ratio of the output transistor decreases as the quantity of driven pixel circuits in each row decreases and increases as the quantity of driven pixel circuits in each row increases. In this example, by setting the aspect ratio of the output transistor of the first gate drive unit of the first gate drive circuit with the first circuit area Q1b larger than the aspect ratio of the output transistor of the first gate drive unit of the first gate drive circuit within the first circuit area Q1a, a driving capability of the first gate drive circuit within the first circuit area Q1b can be improved, thereby ensuring that the pixel circuits within the first circuit areas Q1a and Q1b receive consistent gate drive signals. However, this embodiment is not limited thereto. In some examples, the drive loads of the first gate drive circuits within the two first circuit areas Q1a and Q1b are substantially the same, and the structures of the first gate drive circuits within the first circuit areas Q1a and Q1b may be substantially the same.

In some exemplary implementations, within the first circuit area Q1b, a drive load of a first gate drive unit proximate to the third circuit area Q3 is different from a drive load of a first gate drive unit proximate to the second circuit area Q2. For example, a difference between a quantity of pixel circuits in the pixel circuit row driven by the first gate drive unit, within the first circuit area Q1b, proximate to the second circuit area Q2 and a quantity of pixel circuits in the pixel circuit row driven by the first gate drive unit, within the first circuit area Q1b, proximate to the third circuit area Q3 is greater than a threshold value. The aspect ratio of the output transistor of the first gate drive unit, within the first circuit area Q1b, proximate to the second circuit area Q2 may be larger than the aspect ratio of the output transistor of the first gate drive unit, within the first circuit area Q1b, near the third circuit area Q3, thereby improving the driving capability of the first gate drive unit, within the first circuit area Q1b, proximate to the second circuit area Q2.

In some exemplary implementations, the first gate drive circuit within the first circuit area Q1b may include a first sub-circuit Q1b-1 and a second sub-circuit Q1b-2 which are cascaded. The first sub-circuit Q1b-1 and the second sub-circuit Q1b-2 are misaligned in the first direction X. That is, a plurality of cascaded first gate drive units included in the first sub-circuit Q1b-1 and a plurality of cascaded first gate drive units included in the second sub-circuit Q1b-2 are not successively arranged in the second direction Y. A cascaded signal between a first gate drive unit in a last stage of the first sub-circuit Q1b-1 and a first gate drive unit in a first stage of the second sub-circuit Q1b-2 is transmitted through a connection line extending in the first direction X.

In this example, by arranging the first gate drive circuit within the first circuit area Q1b in sections, a reasonable layout of the gate drive circuit in an abnormal cut display substrate can be achieved. However, this embodiment is not limited thereto. In some examples, the first gate drive circuit within the first circuit area Q1b may not be segmented or may be divided into at least three sub-circuits (i.e. a plurality of cascaded first gate drive units are grouped into three or more groups).

Other structure of circuit structure layer in this embodiment may be referred to the descriptions of the above embodiments and are not repeated here again. The structure (or method) shown in this embodiment may be combined with structures (or methods) shown in other embodiments as appropriate.

Figure 14:
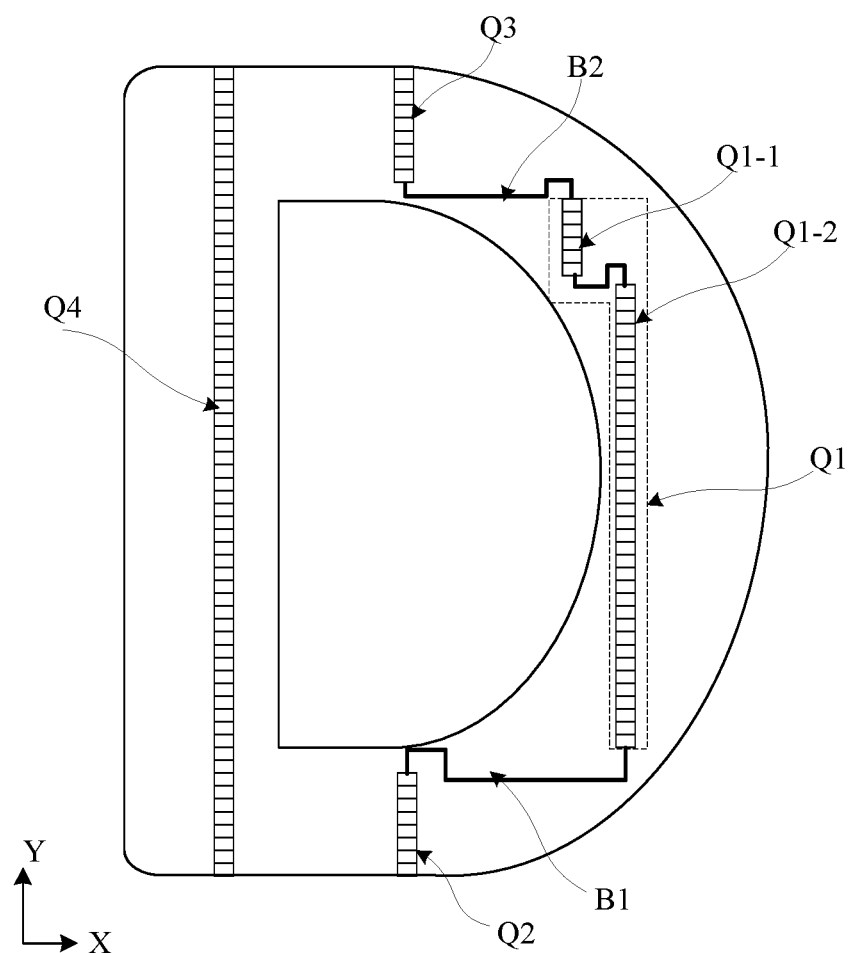
FIG. 14 is another schematic diagram of a display substrate according to at least one embodiment of the present disclosure.

FIG. 14 is another schematic diagram of a display substrate according to at least one embodiment of the present disclosure. In some exemplary implementations as shown in FIG. 14, a display area may be a letter D-shaped. The display area is asymmetrical in the first direction X. The circuit structure layer may include a first circuit area Q1, a second circuit area Q2, a third circuit area Q3, a fourth circuit area Q4, a first connection line area B1, and a second connection line area B2. In the second direction Y, the third circuit area Q3, the second connection line area B2, the first circuit area Q1, the first connection line area B1, and the second circuit area Q2 are arranged in sequence. In the first direction X, the fourth circuit area Q4 is located on a same side of the first circuit area Q1, the second circuit area Q2 and the third circuit area Q3.

In some exemplary implementations, the first circuit area Q1 includes at least one first gate drive circuit, the second circuit area Q2 includes at least one second gate drive circuit, and the third circuit area Q3 includes at least one third gate drive circuit. The third gate drive circuit within the third circuit area Q3 is cascaded with the first gate drive circuit within the first circuit area Q1, and the first gate drive circuit within the first circuit area Q1 is cascaded with the second gate drive circuit within the second circuit area Q2. For example, the third gate drive circuit within the third circuit area Q3 provides a cascaded signal to the first gate drive circuit within the first circuit area Q1, and the first gate drive circuit receives the cascaded signal provided by the third gate drive circuit and outputs a gate control signal to a corresponding pixel circuit; the first gate drive circuit with the first circuit area Q1 provides a cascaded signal to the second gate drive circuit within the second circuit area Q2, and the second gate drive circuit receives the cascaded signal provided by the first gate drive circuit and outputs a gate control signal to a corresponding pixel circuit. In some exemplary implementations, the first gate drive circuit within the first circuit area Q1 may include a first sub-circuit Q1-1 and a second sub-circuit Q1-2 which are cascaded. The first sub-circuit Q1*b*-1 and the second sub-circuit Q1*b*-2 are misaligned in the first direction X. In this example, by arranging the first gate drive circuit within the first circuit area Q1 in sections, a reasonable layout of the gate drive circuit in an abnormal cut display substrate can be achieved.

In some exemplary implementations, the fourth gate drive circuit within the fourth circuit area Q4 is not cascaded with the gate drive circuits within the remaining three circuit areas. By dividing the display area into a plurality of areas and driving the areas by a plurality of groups of gate drive circuits, a reasonable layout of gate drive circuits in an abnormal cut display substrate can be achieved.

Other structures of circuit structure layer in this embodiment may be referred to the descriptions of the above embodiments and are not repeated here again. The structure (or method) shown in this embodiment may be combined with structures (or methods) shown in other embodiments as appropriate.

Figure 15:
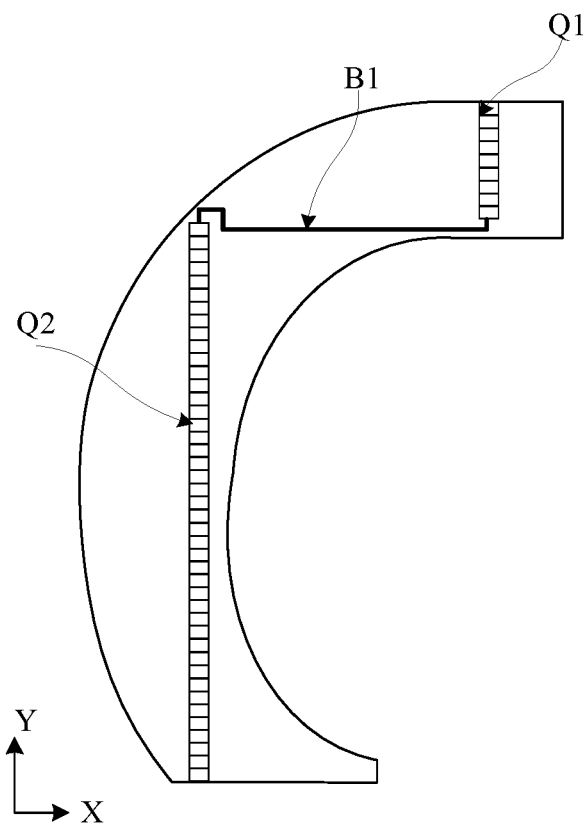
FIG. 15 is another schematic diagram of a display substrate according to at least one embodiment of the present disclosure.

FIG. 15 is another schematic diagram of a display substrate according to at least one embodiment of the present disclosure. In some exemplary implementations as shown in FIG. 15, a display area may be an arc-shaped. The display area is asymmetrical in the first direction X. The circuit structure layer may include a first circuit area Q1, a second circuit area Q2, and a first connection line area B1. A first gate drive circuit within the first circuit area Q1 and a second gate drive circuit within the second circuit area Q2 are misaligned in the first direction X. The first gate drive circuit within the first circuit area Q1 may be cascaded with the second gate drive circuit within the second circuit area Q2 by a signal line within a first connection line area B1.

Other structures of circuit structure layer in this embodiment may be referred to the descriptions of the above embodiments and are not repeated here again. The structure (or method) shown in this embodiment may be combined with structures (or methods) shown in other embodiments as appropriate.

The structure of the display substrate in the exemplary embodiment is described only as an example. In some exemplary implementations, the display area of the display substrate may be in other shapes, such as a letter C shape, or may be in other shapes including a letter D shape, such as a letter B shape, a letter b shape, a letter d shape, a letter p shape, a letter q shape, etc. However, this embodiment is not limited thereto.

According to the display substrate provided in the exemplary embodiment, by disposing the gate drive circuit in the display area and misaligning the gate drive circuit in the first direction after segmenting the gate drive circuit in the display area, the reasonable layout in the abnormal cut display substrate can be achieved, and a requirement for a situation that the driving capabilities required in different areas of the abnormal cut display substrate are inconsistent can be met.

Figure 16:
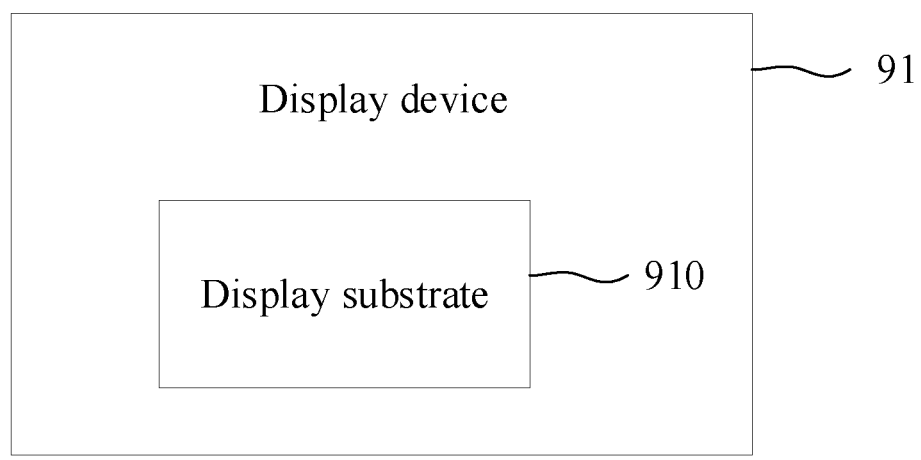
FIG. 16 is a schematic diagram of a display device according to at least one embodiment of the present disclosure.

FIG. 16 is a schematic diagram of a display device according to at least one embodiment of the present disclosure. As shown in FIG. 16, a display device 91 is provided in this embodiment, which includes a display substrate 910 in the aforementioned embodiments. In some examples, the display substrate 910 may be an OLED display substrate or a QLED display substrate. The display device 91 may be any product or component with a display function, such as a mobile phone, a tablet computer, a television, a display, a notebook computer, a digital photo frame, and a navigator. However, this embodiment is not limited thereto.

The drawings of the present disclosure only involve the structures involved in the present disclosure, and other structures may refer to conventional designs. The embodiments in the present disclosure, i.e., features in the embodiments, may be combined with each other to obtain new embodiments if there is no conflict. Those of ordinary skills in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:
1. A display substrate, comprising:
an underlayer substrate comprising a display area; and
a circuit structure layer, located in the display area, wherein:
the circuit structure layer comprises at least one first circuit area and at least one second circuit area;
the first circuit area comprises at least one first gate drive circuit; the second circuit area comprises at least one second gate drive circuit;
the first gate drive circuit is cascaded with the second gate drive circuit;
the first gate drive circuit comprises a plurality of cascaded first gate drive units, and the second gate drive circuit comprises a plurality of cascaded second gate drive units; the plurality of first gate drive units are sequentially arranged in a second direction, and the plurality of second gate drive units are sequentially arranged in the second direction;
the first circuit area and the second circuit area are misaligned in a first direction; the first direction is intersected with the second direction;
the circuit structure layer further comprises: a first connection line area; the first connection line area comprises at least one first signal line and at least one first connection line; the first signal line comprises at least one first sub-signal line and at least one second sub-signal line;
the first sub-signal line is electrically connected with the first gate drive circuit, and the second sub-signal line is electrically connected with the second gate drive circuit;

the first sub-signal line and the second sub-signal line are electrically connected by at least one first connection line, and the first connection line extends along the first direction;

the first connection area further comprises at least one first jumper line extending in the second direction; wherein the first jumper line is electrically connected with two first connection lines for transmitting a same signal; and the first jumper line spans at least pixel circuits in two rows in the second direction.

2. The display substrate of claim 1, wherein:

the circuit structure layer further comprises: pixel circuits in a plurality of rows, wherein pixel circuits in each row comprise a plurality of pixel circuits arranged along the first direction;

in the first circuit area, the pixel circuits in the plurality of rows and a plurality of cascaded first gate drive units are arranged at intervals along the second direction; and in the second circuit area, the pixel circuits in the plurality of rows and the plurality of cascaded second gate drive units are arranged at intervals along the second direction.

3. The display substrate of claim 1, wherein the first signal line comprises a cascaded signal line between the first gate drive circuit and the second gate drive circuit; or, the plurality of first signal lines comprise a cascaded signal line between the first gate drive circuit and the second gate drive circuit, and a common signal line of the first gate drive circuit and the second gate drive circuit.

4. The display substrate of claim 1, wherein the first jumper line is located on a side of the first connection line away from the underlayer substrate in a direction perpendicular to the display substrate.

5. The display substrate of claim 4, wherein:

in the direction perpendicular to the display substrate, the display substrate comprises: a semiconductor layer, a first conductive layer, a second conductive layer, and a third conductive layer which are disposed on the underlayer substrate;

the semiconductor layer at least comprises active layers of a plurality of transistors;

the first conductive layer at least comprises gates of the plurality of transistors and first electrodes of a plurality of capacitors;

the second conductive layer at least comprises second electrodes of the plurality of capacitors;

the third conductive layer at least comprises first electrodes and second electrodes of the plurality of transistors; and the first jumper line is located in the third conductive layer, and the first connection line and the second connection line are located in the first conductive layer or the second conductive layer.

6. The display substrate of claim 1, wherein the display area is further provided with a plurality of data lines extending in the second direction; the first jumper line is disposed in a same layer as the data line.

7. The display substrate of claim 6, wherein the first connection line area comprises a plurality of first jumper lines arranged between a plurality of adjacent data lines.

8. The display substrate of claim 1, wherein:

the circuit structure layer comprises two first circuit areas and one second circuit area; the two first circuit areas are sequentially arranged in the first direction; each first circuit area comprises a first gate drive circuit and the second circuit area comprises a second gate drive circuit; and the first gate drive circuit of a first first circuit area provides a first cascaded signal to the second gate drive circuit, and the first gate drive circuit of a second first circuit area provides a second cascaded signal to the second gate drive circuit; impedance of a signal line transmitting the first cascaded signal is substantially the same as impedance of a signal line transmitting the second cascaded signal.

9. The display substrate of claim 8, wherein structures of the first gate drive circuits within the two first circuit areas are substantially the same.

10. The display substrate of claim 9, wherein the display area are-is substantially symmetrical about a center line in the first direction.

11. The display substrate of claim 10, wherein the display area is heart-shaped or letter Y-shaped.

12. The display substrate of claim 10, wherein:

the circuit structure layer further comprises: a third circuit area comprising at least one third gate drive circuit; the third gate drive circuit comprises a plurality of cascaded third gate drive units arranged sequentially along a second direction;

the third circuit area is misaligned from the two first circuit areas in the first direction and is located on a side of the two first circuit areas away from the second circuit area in the second direction; and the third gate drive circuit is cascaded with the first gate drive circuits within the two first circuit areas.

13. The display substrate of claim 12, wherein the display area is elliptical or annular.

14. The display substrate of claim 8, wherein aspect ratios of output transistors of the first gate drive units of the first gate drive circuits within the two first circuit areas are different.

15. The display substrate of claim 14, wherein the display area is letter D-shaped.

16. The display substrate of claim 15, wherein the first gate drive circuit within one of the first circuit areas comprises a first sub-circuit and a second sub-circuit which are cascaded, wherein the first sub-circuit and the second sub-circuit are misaligned in the first direction.

17. A display device, comprising the display substrate according to claim 1.

* * * * *